(12) United States Patent
Yoon et al.

(10) Patent No.: US 10,373,961 B2
(45) Date of Patent: Aug. 6, 2019

(54) SEMICONDUCTOR DEVICE INCLUDING CONTACT STRUCTURE

(71) Applicant: Samsung Electronics Co., Ltd., Suwon-si, Gyeonggi-do (KR)

(72) Inventors: Chan-sic Yoon, Anyang-si (KR); Ki-seok Lee, Hwaseong-si (KR); Jung-hyun Kim, Seoul (KR); Je-min Park, Suwon-si (KR)

(73) Assignee: SAMSUNG ELECTRONICS CO., LTD, Gyeonggi-Do (KR)

( * ) Notice: Subject to any disclaimer, the term of this patent is extended or adjusted under 35 U.S.C. 154(b) by 0 days.

(21) Appl. No.: 15/884,504

(22) Filed: Jan. 31, 2018

(65) Prior Publication Data

US 2018/0350818 A1    Dec. 6, 2018

(30) Foreign Application Priority Data

Jun. 2, 2017  (KR) ......................... 10-2017-0069074

(51) Int. Cl.
*H01L 29/00* (2006.01)
*H01L 27/108* (2006.01)
(Continued)

(52) U.S. Cl.
CPC .. *H01L 27/10888* (2013.01); *H01L 21/02109* (2013.01); *H01L 21/02697* (2013.01);
(Continued)

(58) Field of Classification Search
CPC ......... H01L 27/10876; H01L 27/10894; H01L 27/10891; H01L 27/10855;
(Continued)

(56) References Cited

U.S. PATENT DOCUMENTS 6,136,647 A    10/2000  Sung
7,374,997 B2    5/2008  Joo
(Continued)

FOREIGN PATENT DOCUMENTS

JP    2013206931 A    10/2013
KR    100380270 B1    4/2003
(Continued)

*Primary Examiner* — Theresa T Doan
(74) *Attorney, Agent, or Firm* — Harness, Dickey & Pierce, P.L.C.

(57) ABSTRACT

A semiconductor device includes first wiring line patterns on a support layer, second wiring line patterns on the first wiring line patterns, and a multiple insulation pattern. The first wiring line patterns extend in a first direction and are spaced apart from each other in a second direction. The support layer includes first contact hole patterns between the first wiring line patterns that are spaced apart from each other in the first and second directions. The second wiring line patterns extend in the second direction perpendicular and are spaced apart from each other in the first direction. The multiple insulation pattern is on an upper surface of the support layer where the first contact hole patterns are not formed, arranged in a third direction perpendicular to the first direction and the second direction, and between the first wiring line patterns and the second wiring line patterns.

18 Claims, 37 Drawing Sheets

(51) Int. Cl.
*H01L 21/02* (2006.01)
*H01L 21/768* (2006.01)

(52) U.S. Cl.
CPC ...... *H01L 21/768* (2013.01); *H01L 27/10814* (2013.01); *H01L 27/10855* (2013.01); *H01L 27/10885* (2013.01); *H01L 27/10894* (2013.01); *H01L 27/10897* (2013.01); *H01L 27/10823* (2013.01)

(58) Field of Classification Search
CPC ......... H01L 27/10885; H01L 27/10888; H01L 27/10897; H01L 27/1116
USPC ........................................................ 257/506
See application file for complete search history.

(56) References Cited

U.S. PATENT DOCUMENTS

| | | |
|---|---|---|
| 8,043,923 B2 | 10/2011 | Kim et al. |
| 8,455,343 B2 | 6/2013 | Jang |
| 8,673,754 B2 | 3/2014 | Lee et al. |
| 9,478,548 B2 | 10/2016 | Lee et al. |
| 2012/0049255 A1 | 3/2012 | Ryu |
| 2014/0264568 A1 | 9/2014 | Kim et al. |
| 2015/0294923 A1* | 10/2015 | Shin ................ H01L 23/481 |
| | | 257/532 |

FOREIGN PATENT DOCUMENTS

| | | |
|---|---|---|
| KR | 20120003715 A | 1/2012 |
| KR | 20140100647 A | 8/2014 |

\* cited by examiner

SEMICONDUCTOR DEVICE INCLUDING CONTACT STRUCTURE

CROSS-REFERENCE TO RELATED APPLICATION

This application claims the benefit of Korean Patent Application No. 10-2017-0069074, filed on Jun. 2, 2017, in the Korean Intellectual Property Office, the disclosure of which is incorporated herein in its entirety by reference.

BACKGROUND

Inventive concepts relate to a semiconductor device, and more particularly, to a semiconductor device including a contact structure.

The development of electronic technology has brought about rapid progress in the reduction in size of semiconductor devices, that is, down-scaling. In order to improve performance of down-scaled semiconductor devices, reliability of a contact process has to be increased. Accordingly, down-scaled semiconductor devices need to be manufactured using a device structure improved (and/or optimized) to increase contact process reliability or an improved (and/or optimized) method of manufacturing the device structure therefor.

SUMMARY

Inventive concepts relate to a semiconductor device having an improved (and/or optimized) contact structure whereby reliability of a contact process may be increased.

According to some example embodiments of inventive concepts, a semiconductor device includes a support layer, a plurality of first wiring line patterns, a plurality of second wiring line patterns, and a multiple insulation pattern. The support layer includes a plurality of first contact hole patterns in the support layer. The plurality of first contact hole patterns are spaced apart from each other in a first direction and a second direction that is perpendicular to the first direction. The plurality of first wiring line patterns extend on the support layer in the first direction. The plurality of first wiring line patterns are spaced apart from each other in the second direction such that plurality of first contact hole patterns are planarly between the plurality of first wiring line patterns. The plurality of second wiring line patterns are on the plurality of first wiring line patterns and the plurality of first contact hole patterns and extend in the second direction in a direction perpendicular to the first wiring line patterns and spaced apart from each other in the first direction. The multiple insulation pattern is on an upper surface of the support layer where the plurality of first contact hole patterns are not formed. The multiple insulation pattern is arranged in a third direction that is perpendicular to the first direction and the second direction, and the multiple insulation pattern is between the plurality of first wiring line patterns and the plurality of second wiring line patterns.

According to some example embodiments of inventive concepts, a semiconductor device includes a substrate, a plurality of word lines extending in the substrate in a first direction and are spaced apart from each other in a second direction that is perpendicular to the first direction, a plurality of direct contact hole patterns in the substrate between the plurality of word lines in the first direction and the second direction, a plurality of bit lines on the word lines and the direct contact hole patterns and extending in the second direction perpendicular to the word lines and spaced apart from each other in the first direction, and a multiple insulation pattern on an upper surface of the substrate where the direct contact hole patterns are not formed. The multiple insulation pattern is arranged in a third direction perpendicular to the first direction and the second direction, and between the plurality of word lines and the plurality of bit lines.

According to some example embodiments of inventive concepts, a semiconductor device includes a substrate having a cell array region and a peripheral circuit region, the cell array region including a cell active region and the peripheral circuit region including a peripheral circuit active region; a plurality of word line structures extending in the cell active region in the substrate in a first direction and the plurality of word line structures being spaced apart from each other in a second direction perpendicular to the first direction; a plurality of direct contact hole patterns opening the cell active region between the plurality of word line structures of the cell array region and the plurality of direct contact hole patterns being spaced apart from each other in the substrate; a plurality of bit line structures extending on the direct contact hole patterns and the substrate of the cell array region in the second direction perpendicular to the plurality of word line structures and the plurality of bit lines structures being spaced apart from each other in the first direction; a multiple insulation pattern on an upper surface of the substrate in the cell array region where the direct contact hole patterns are not formed, the multiple insulation pattern being arranged in a third direction that is perpendicular to the first direction and the second direction, and the multiple insulation pattern being arranged between the word line structures and the plurality of bit line structures; and a peripheral circuit gate structure on the peripheral circuit active region of the peripheral circuit region.

A semiconductor device according some example embodiments of inventive concepts may include a multiple insulation pattern between first wiring line patterns and second wiring line patterns on a substrate in a vertical direction. Accordingly, in semiconductor devices according to example embodiments of inventive concepts, reliability of a process of forming contacts to be formed at a side of the first wiring line patterns and the second wiring line patterns may be increased.

A semiconductor device according to some example embodiments of inventive concepts may include a multiple insulation pattern between word lines and bit lines on a substrate in a vertical direction. Accordingly, reliability of a process of forming contacts to be formed at a side of the word lines and the bit lines may be increased.

BRIEF DESCRIPTION OF THE DRAWINGS

Inventive concept will be more clearly understood from the following detailed description taken in conjunction with the accompanying drawings in which.

DETAILED DESCRIPTION

Inventive concepts will now be described more fully with reference to the accompanying drawings, in which example embodiments of inventive concepts are shown. Any one of the embodiments of inventive concepts described below may be implemented, and also, the embodiments described below may be implemented by combining at least two of the embodiments. Therefore, the scope of inventive concepts should not be construed as being limited to any one embodiment.

Figure 1:
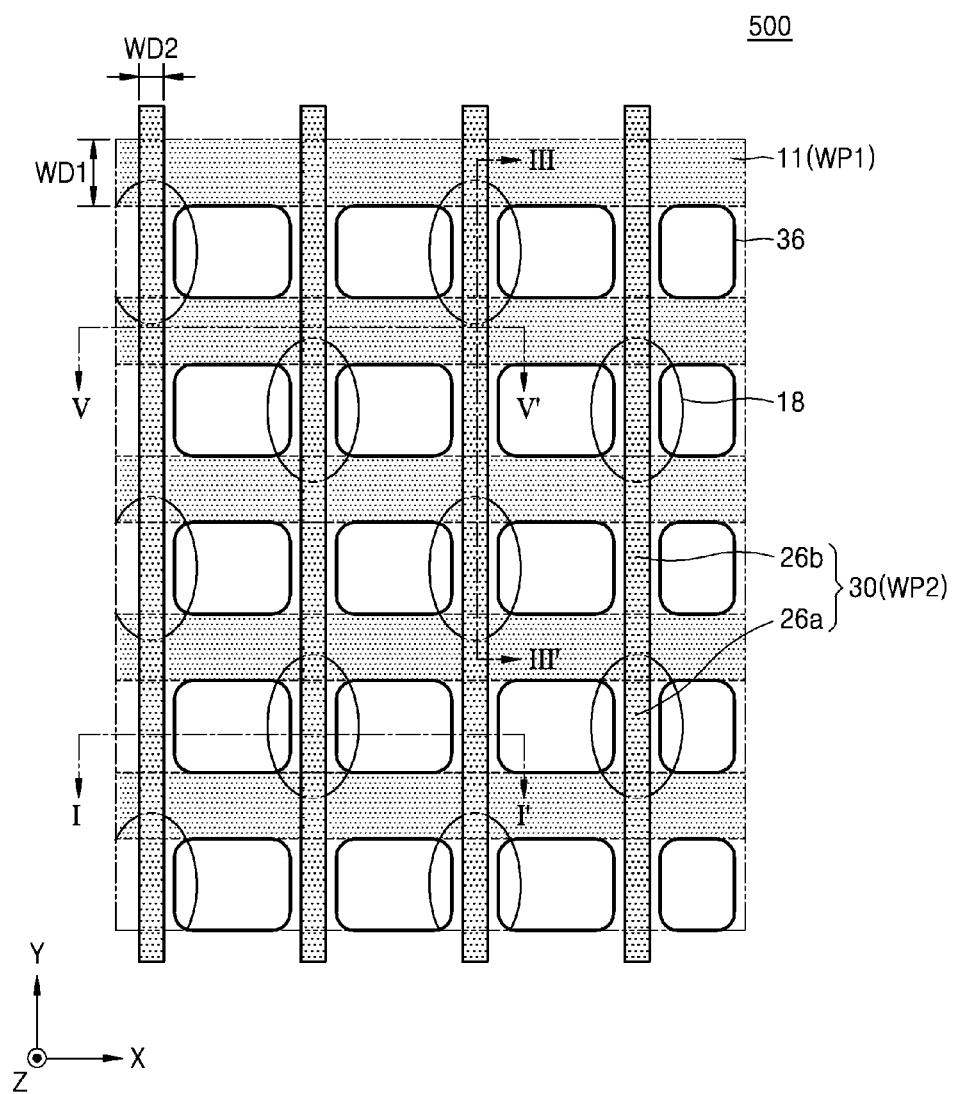
FIG. 1 is a plan view of a semiconductor device according to some example embodiments of inventive concepts.
Figure 2A:
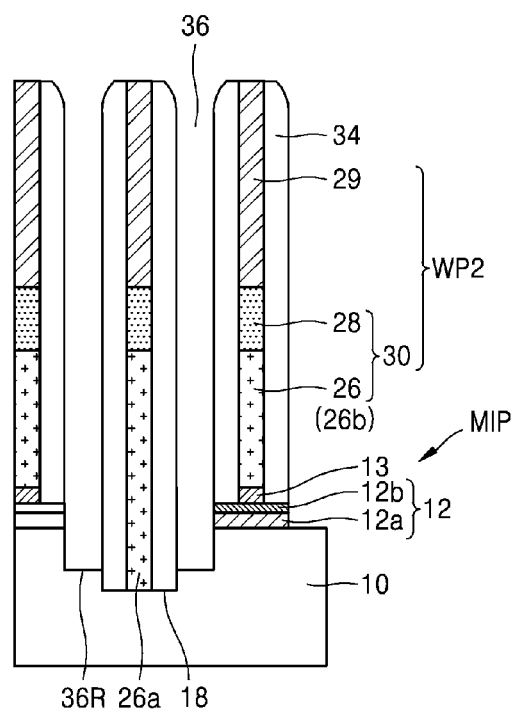
FIGS. 2A through 2C are schematic cross-sectional views of the semiconductor device of FIG. 1, cut along lines I-I, III-III', and V-V', respectively.
Figure 2B:
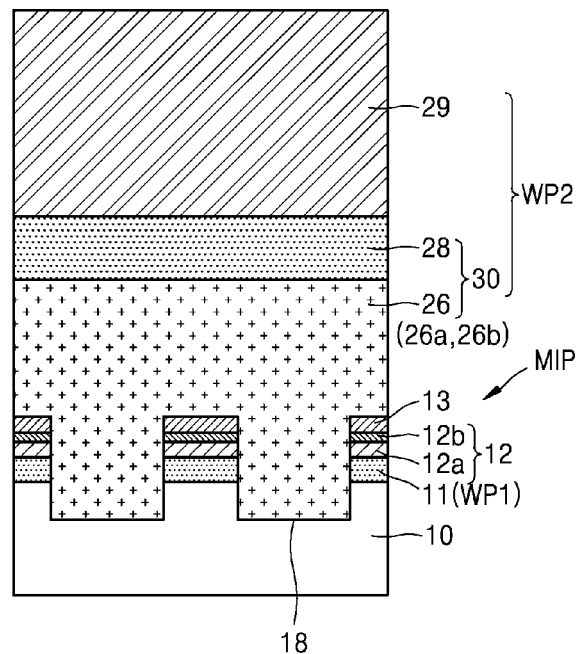
Figure 2C:
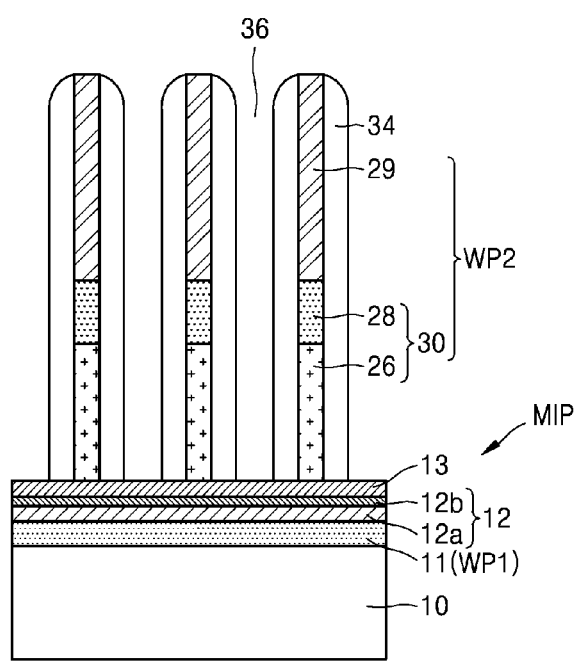

FIG. 1 is a plan view of a semiconductor device 500 according to some example embodiments of inventive concepts. FIGS. 2A through 2C are schematic cross-sectional views of the semiconductor device 500 of FIG. 1, cut along lines I-I, III-III', and V-V', respectively.

In detail, the semiconductor device 500 may include a plurality of first wiring line patterns WP1 that planarly extend on a support layer 10 in a first direction (X direction) and are spaced apart from each other in a second direction (Y direction) perpendicular to the first direction. The support layer 10 may be a substrate, for example, a silicon substrate. The first wiring line patterns WP1 may include a buried line pattern 11 formed on the support layer 10. The first wiring line patterns WP1 may have a width WD1 and be arranged in the first direction.

A plurality of first contact hole patterns 18 spaced apart from each other in the first direction and the second direction are arranged between the first wiring line patterns WP1. The first contact hole patterns 18 may be referred to as a first contact hole. The first contact hole patterns 18 may be formed inside the support layer 10. A plurality of second wiring line patterns WP2 extending in the second direction (Y direction) perpendicular to the first wiring line patterns WP1 and spaced apart from each other in the first direction (X direction) are disposed on the first wiring line patterns WP1 and the first contact hole patterns 18 two-dimensionally. The second wiring line patterns WP2 may have a width WD2 and be disposed in the second direction.

The second wiring line patterns WP2 may include a contact pattern 26a formed in the first contact hole patterns 18 and a non-contact pattern 26b formed on an upper portion of the support layer 10 where the first contact hole pattern 18 is not formed. The second wiring line patterns WP2 may be a double wiring line pattern 30 including a lower wiring line pattern 26 and an upper wiring line pattern 28. The second wiring line patterns WP2 may further include a capping pattern 29 formed on the upper wiring line pattern 28. A spacer layer 34 may be disposed on two side surfaces of the second wiring line patterns WP2.

A plurality of second contact hole patterns 36 are spaced apart from each other in the first direction and the second direction two-dimensionally between the first wiring line patterns WP1 and the second wiring line patterns WP2, adjacent to the first contact hole patterns 18. The second contact hole patterns 36 may be referred to as a second contact hole. The second contact hole patterns 36 may be a recess contact hole pattern 36R that is less etched to become a higher portion of the support layer 10 than the first contact hole pattern 18.

A multiple insulation pattern MIP is formed on an upper surface of the support layer 10 where the first contact hole pattern 18 is not formed, in a third direction (Z direction) perpendicular to the first direction and the second direction, and between the first wiring line patterns WP1 and the second wiring line patterns WP2. The multiple insulation pattern MIP may include a first protection pattern 12 formed on the support layer 10 and a second protection pattern 13 formed on the first protection pattern 12. The multiple insulation pattern MIP may be included to protect the support layer 10 and also help to reliably form the first contact hole patterns 18 and the second contact hole patterns 36. The second protection pattern 13 may be formed to reliably form the second contact hole patterns 36.

The multiple insulation pattern MIP may include a first protection pattern 12 formed on the support layer 10 and a second protection pattern 13 formed on the first protection pattern 12. The first protection pattern 12 may include a first silicon oxide pattern 12a and a first silicon nitride pattern 12b formed on the first silicon oxide pattern 12a.

The second protection pattern 13 may be a second silicon oxide pattern or a second silicon oxy-nitride pattern. The second protection pattern 13 may be a thermal silicon oxide growth pattern or a thermal silicon oxy-nitride growth pattern. The second protection pattern 13 may be a plasma silicon oxide growth pattern or a plasma silicon oxy-nitride growth pattern.

When the second protection pattern 13 is provided as a growth pattern formed using a growth method instead of a deposition method, the support layer 10 may be protected better, and the first contact hole patterns 18 and the second contact hole patterns 36 may be formed more reliably.

FIGS. 3A through 3D are partial cross-sectional views for explaining a method of forming the multiple insulation pattern MIP and the second wiring line pattern WP2 of FIG. 2A.

Figure 3A:
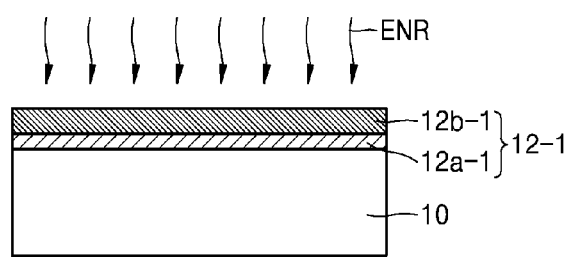
FIGS. 3A through 3D are partial cross-sectional views for explaining a method of forming a multiple insulation pattern and a second wiring line pattern of FIG. 2A.
Figure 3B:
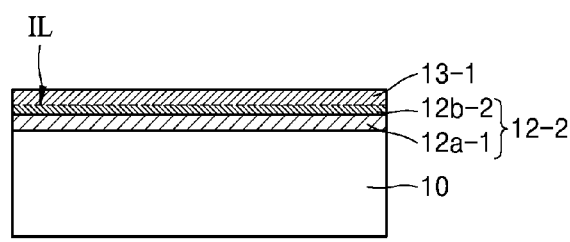

Referring to FIGS. 3A and 3B, as illustrated in FIG. 3A, a first preliminary protection layer 12-1 is formed on the support layer 10. The first preliminary protection layer 12-1 includes a first silicon oxide layer 12a-1 and a first preliminary silicon nitride layer 12b-1 that are sequentially formed on the support layer 10. Energy ENR, for example, thermal energy or plasma energy, is applied to the first preliminary silicon nitride layer 12b-1 forming the first preliminary protection layer 12-1.

Then, a thickness of the first preliminary silicon nitride layer 12b-1 may be reduced as illustrated in FIG. 3B so that the first preliminary silicon nitride layer 12b-1 is formed into a first silicon nitride layer 12b-2. Accordingly, a first protection layer 12-2 including the first silicon oxide layer 12a-1 and the first silicon nitride layer 12b-2 which has a reduced thickness may be formed. In addition, a second protection layer 13-1 may be formed on the first silicon nitride layer 12b-2 by using a growth method instead of a deposition method.

When the second protection layer 13-1 is formed using a growth method, an interface IL between the first silicon nitride layer 12b-2 and the second protection layer 13-1 may have a microscopically curved surface, thereby increasing a bonding strength between the first silicon nitride layer 12b-2 and the second protection layer 13-1. Moreover, as the second protection layer 13-1 is formed using a growth method, a material density of the second protection layer 13-1 may be enhanced.

The second protection layer 13-1 may be a silicon oxide layer or a silicon oxy-nitride layer. The second protection layer 13-1 may be a thermal silicon oxide growth layer or a thermal silicon oxy-nitride growth layer. The second protection layer 13-1 may be a plasma silicon oxide growth layer or a plasma silicon oxy-nitride growth layer.

Figure 3C:
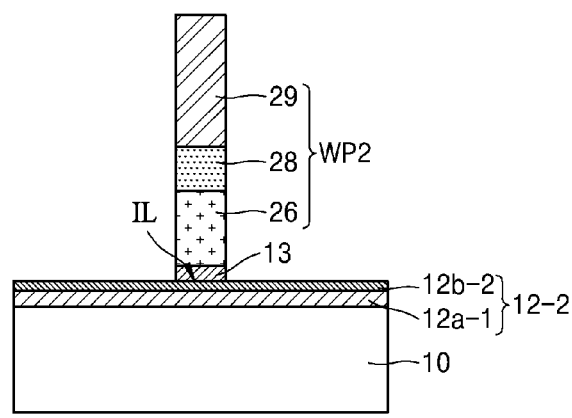

Referring to FIG. 3C, a second wiring line pattern WP2 is formed on the second protection layer 13-1. As described above, the second wiring line pattern WP2 may include a lower wiring line pattern 26, an upper wiring line pattern 28, and a capping pattern 29. The second wiring line pattern WP2 may be formed by forming first a lower wiring layer, an upper wiring layer, and a capping insulation layer on the second protection layer 13-1, and then, photolithography and etching processes.

During an etching operation of forming the second wiring line pattern WP2, the second protection layer 13-1 may be etched to become a second protection pattern 13. When the second protection layer 13-1 is formed using a growth method, the second protection layer 13-1 may limit and/or prevent over-etching of the first protection layer 12-2 and ensure reliable formation of the second wiring line pattern WP2. As described above, the interface IL between the first silicon nitride layer 12b-2 and the second protection pattern 13 may have a microscopically curved surface.

Figure 3D:
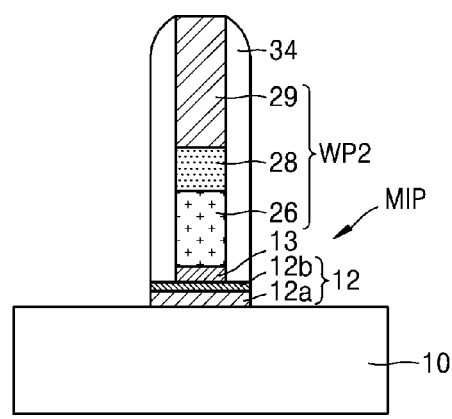

Referring to FIG. 3D, a spacer layer 34 is formed on two sides of the second wiring line pattern WP2. When forming the spacer layer 34, the first protection layer 12-2 may be etched to become the first protection pattern 12. The first protection pattern 12 may include a first silicon oxide pattern 12a and a first silicon nitride pattern 12b formed on the first silicon oxide pattern 12a.

Through the above-described manufacturing operation, a multiple insulation pattern MIP may be formed under the second wiring line pattern WP2 and on an upper surface of the support layer 10. The multiple insulation pattern MIP protects the support layer 10 and may also help to reliably form the contact hole patterns near the second wiring line pattern WP2 (the first and second contact hole patterns 18 and 36 in FIGS. 1 and 2A through 2C).

FIGS. 4A through 8C are views for explaining a method of manufacturing the semiconductor device 500 of FIGS. 1 and 2A through 2C. FIGS. 4A through 8A are respectively cross-sectional views of a portion of FIGS. 4C through 8C cut along a line I-I'. FIGS. 4B through 8B are respectively cross-sectional views of a portion of FIGS. 4C through 8C cut along a line III-III'. FIGS. 4C through 8C are plan views for describing a method of manufacturing the semiconductor device 500 of FIGS. 1 and 2A through 2C.

Figure 4A:
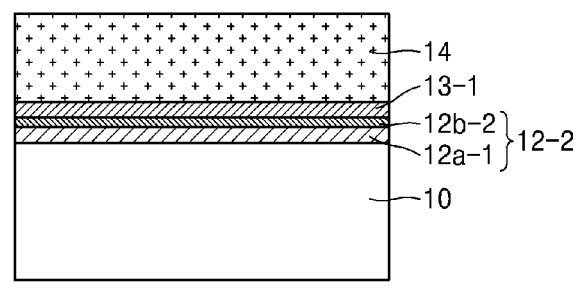
FIGS. 4A through 8C are views for explaining a method of manufacturing the semiconductor device of FIGS. 1 and 2A through 2C.
Figure 4B:
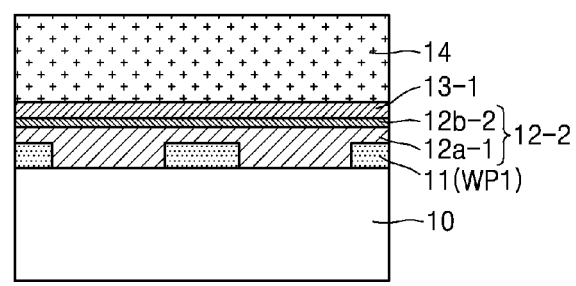
Figure 4C:
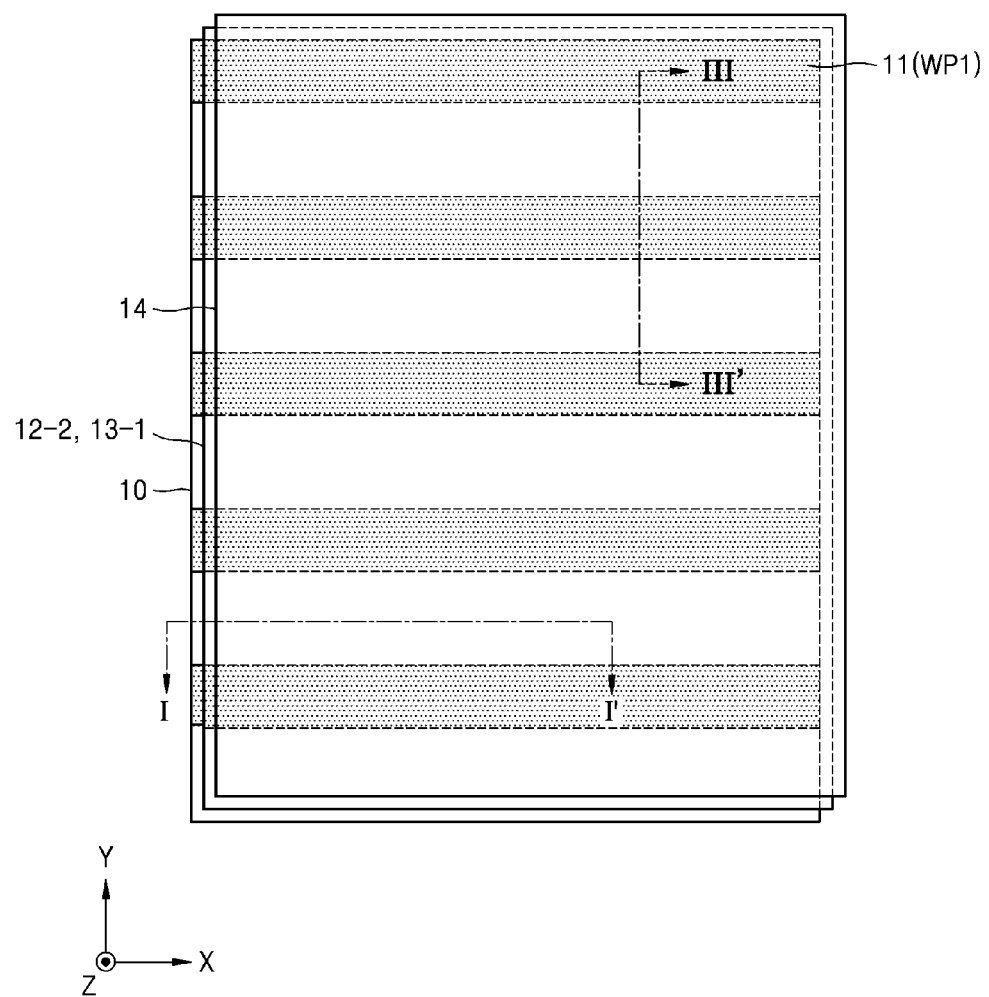

Referring to FIGS. 4A through 4C, a plurality of buried line patterns 11 are formed on the support layer 10. The support layer 10 may be a substrate, for example, a silicon substrate. The buried line patterns 11 may be the first wiring line patterns WP1. The first wiring line patterns WP1 may extend in the first direction (X-axis direction) two-dimensionally as illustrated in FIG. 4C, and may be spaced apart from each other in the second direction (Y axis direction) perpendicular to the first direction. The first wiring line patterns WP1 may be word line patterns in a semiconductor device.

A first protection layer 12-2 is formed on the support layer 10 and the buried line patterns 11. The first protection layer 12-2 may be formed on the support layer 10, on the buried line patterns 11, and between the buried line patterns 11. The first protection layer 12-2 may include a first silicon oxide layer 12a-1 and a first silicon nitride layer 12b-2. A second protection layer 13-1 is formed on the first protection layer 12-2. The method of forming the second protection layer 13-1 is described above with reference to FIGS. 3A and 3B, and thus description thereof will be omitted here.

A first wiring layer 14 is formed on the second protection layer 13-1. The first wiring layer 14 may be formed on the entire surface of the second protection layer 13-1 on the support layer 10. The first wiring layer 14 may include a conductive layer, for example, a metal layer. The first wiring layer 14 may also be formed of a polysilicon layer doped with an impurity.

Figure 5A:
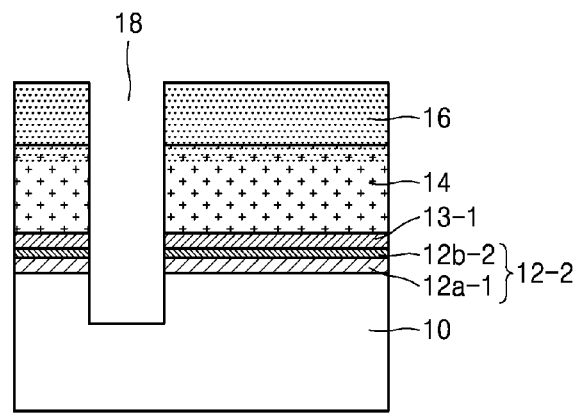
Figure 5B:
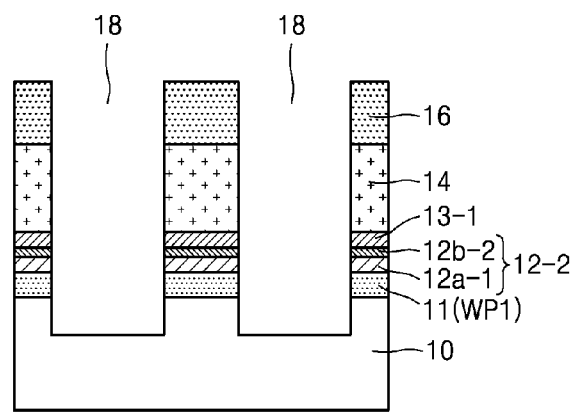
Figure 5C:
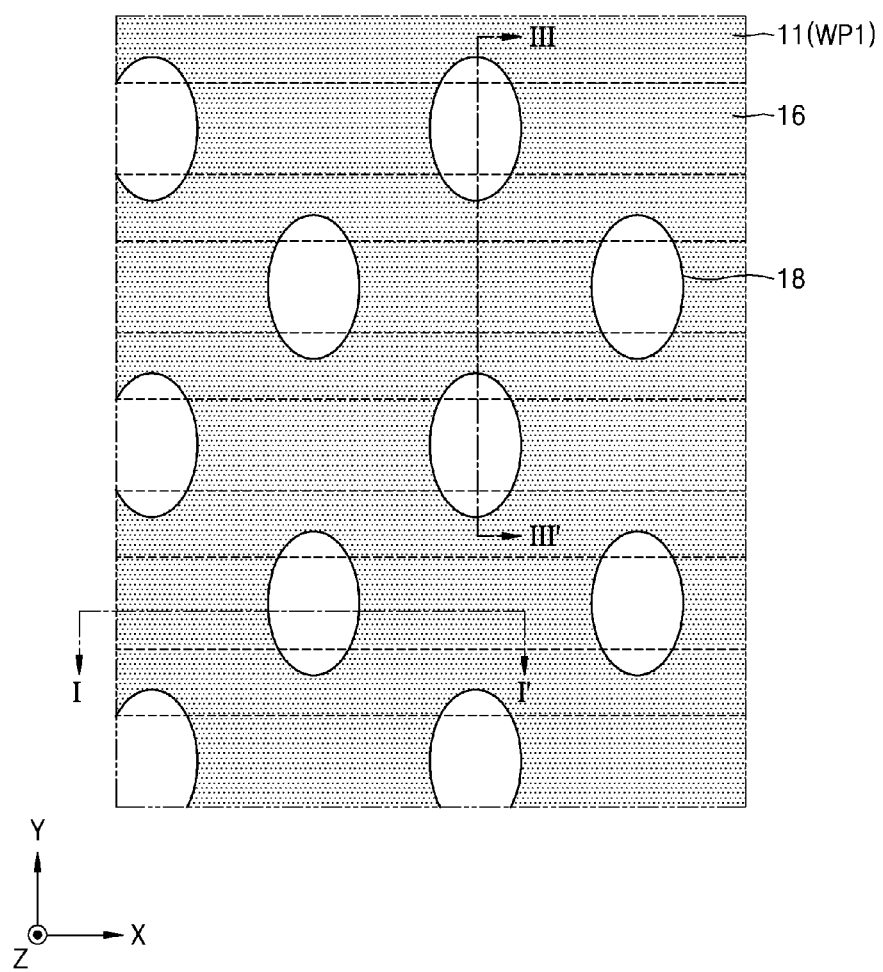

Referring to FIGS. 5A through 5C, a mask pattern 16 is formed on the first wiring layer 14. The mask pattern 16 may be a photoresist pattern formed using photolithography and etching processes. For example, the mask pattern 16 may be formed by forming a photoresist layer on the first wiring layer 14, and then exposing and developing the photoresist layer. The first wiring layer 14, the second protection layer 13-1, the first protection layer 12-2, and the support layer 10 are sequentially etched using the mask pattern 16 as an etching mask, so as to form a plurality of first contact hole patterns 18. The first contact hole patterns 18 may expose a surface of the support layer 10.

The first contact hole patterns 18 may be spaced apart from each other in the first direction and the second direction two-dimensionally as illustrated in FIG. 5C. The first contact hole patterns 18 may be formed between the first wiring line patterns WP1 and spaced apart from each other in the first direction and the second direction. In FIGS. 5A through 5C, the first contact hole patterns 18 are illustrated as being formed inside the support layer 10 by etching the support layer 10, but also, etching may be suspended on a surface of the support layer 10 to form the first contact hole patterns 18 on a surface of the support layer 10.

Figure 6A:
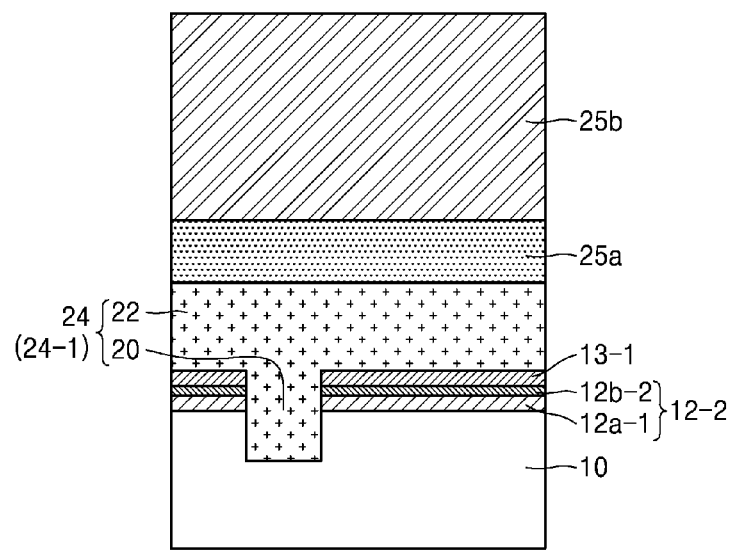
Figure 6B:
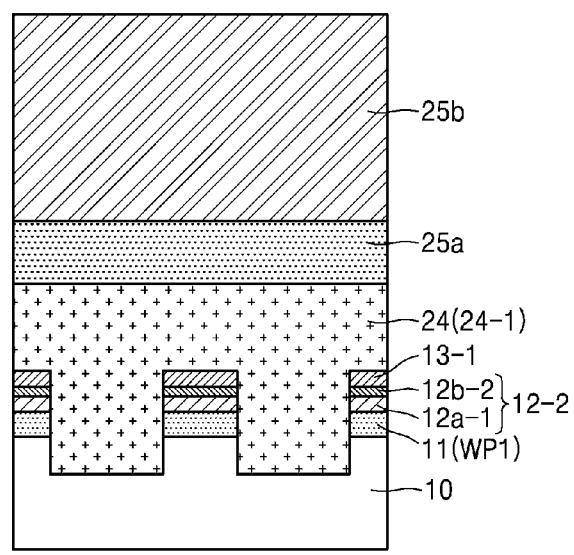
Figure 6C:
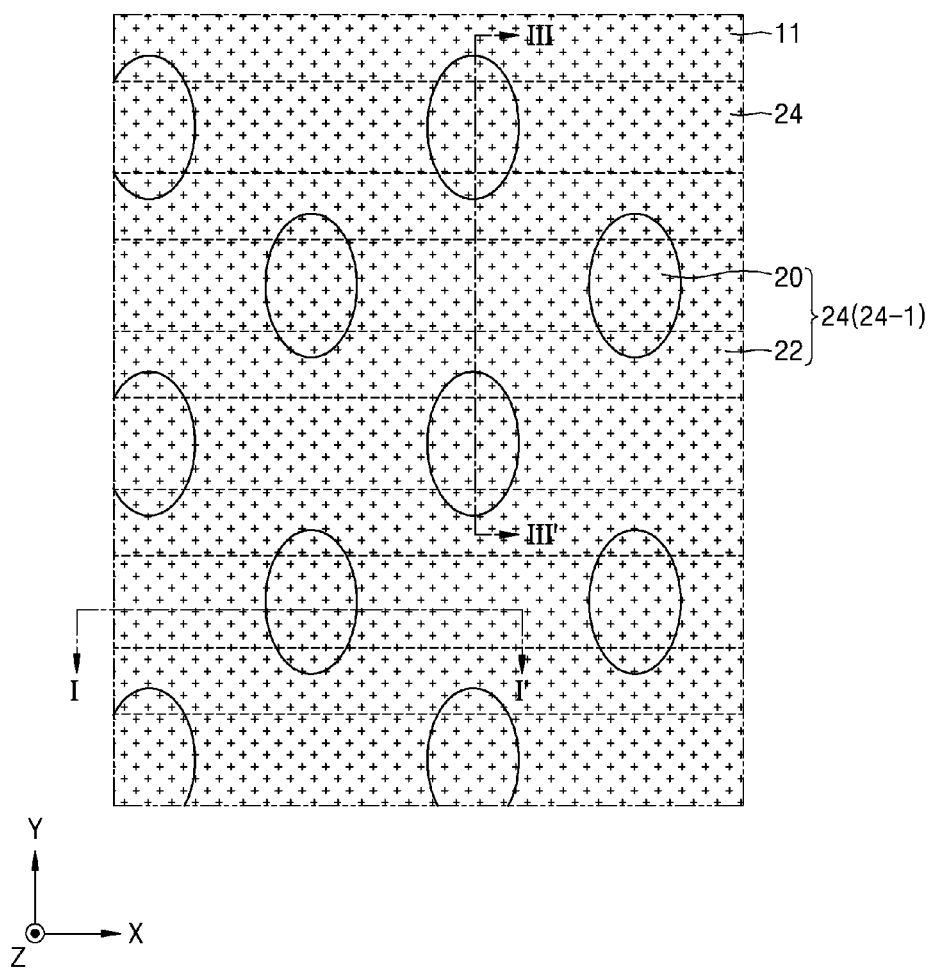

Referring to FIGS. 6A through 6C, the mask pattern 16 is removed. Next, a second wiring layer 24 is formed on the first wiring layer 14 that fills the first contact hole patterns 18. The second wiring layer 24 may be formed on the entire surface of the first wiring layer 14 on the support layer 10. The second wiring layer 24 may include a conductive layer, for example, a metal layer. The second wiring layer 24 may include an impurity-doped polysilicon layer. After forming the second wiring layer 24, the second wiring layer 24 may be etch-backed.

In FIGS. 6A through 6C, the first wiring layer 14 and the second wiring layer 24 are illustrated and referred to as one, as a wiring layer 24-1. The wiring layer 24-1 may fill an inner portion of the first contact hole patterns 18 and be formed on the entire surface of the second protection layer 13-1. The wiring layer 24-1 may be filled in the first contact hole patterns 18 as illustrated in FIGS. 6A through 6C so as to include a first contact 20 (or a contact layer) that is filled in the first contact hole patterns 18 to contact the support layer 10 and a non-contact 22 (or a non-contact layer) that is not filled in the first contact hole patterns 18 but formed on the second protection layer 13-1 on the support layer 10.

Next, a third wiring layer 25a and a capping layer 25b are formed on the wiring layer 24-1. According to necessity, the capping layer 25b may be omitted. The third wiring layer 25a may include a conductive layer. For example, the third wiring layer 25a may be a tungsten layer. The capping layer 25b may be an insulation layer. For example, the capping layer 25b may be a silicon nitride layer. In FIG. 6C, the third wiring layer 25a and the capping layer 25b are not illustrated for convenience.

Figure 7A:
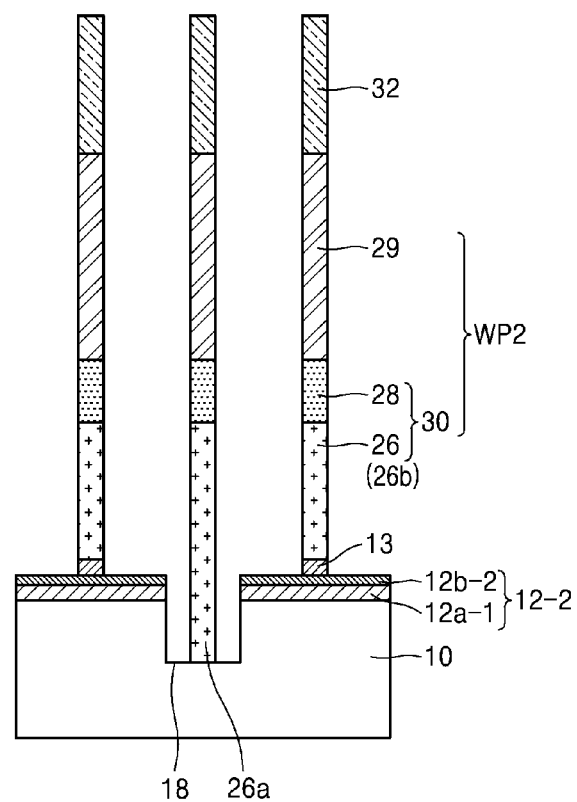
Figure 7B:
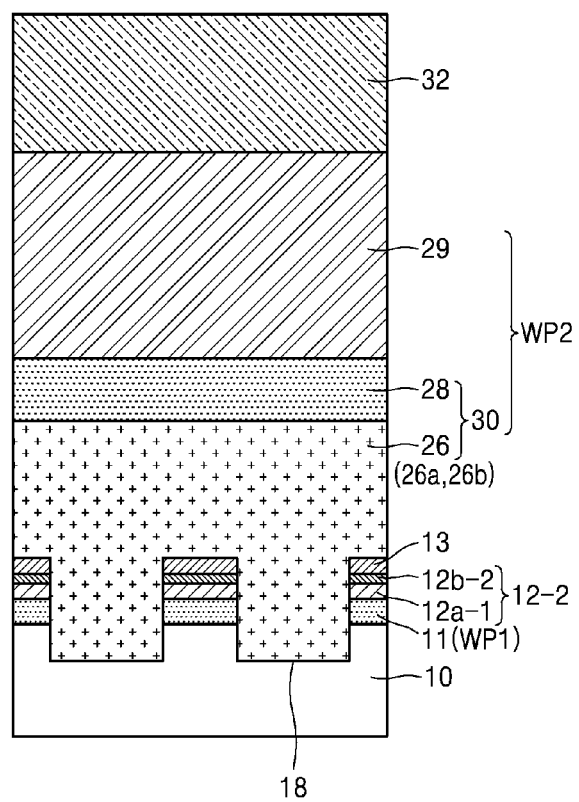
Figure 7C:
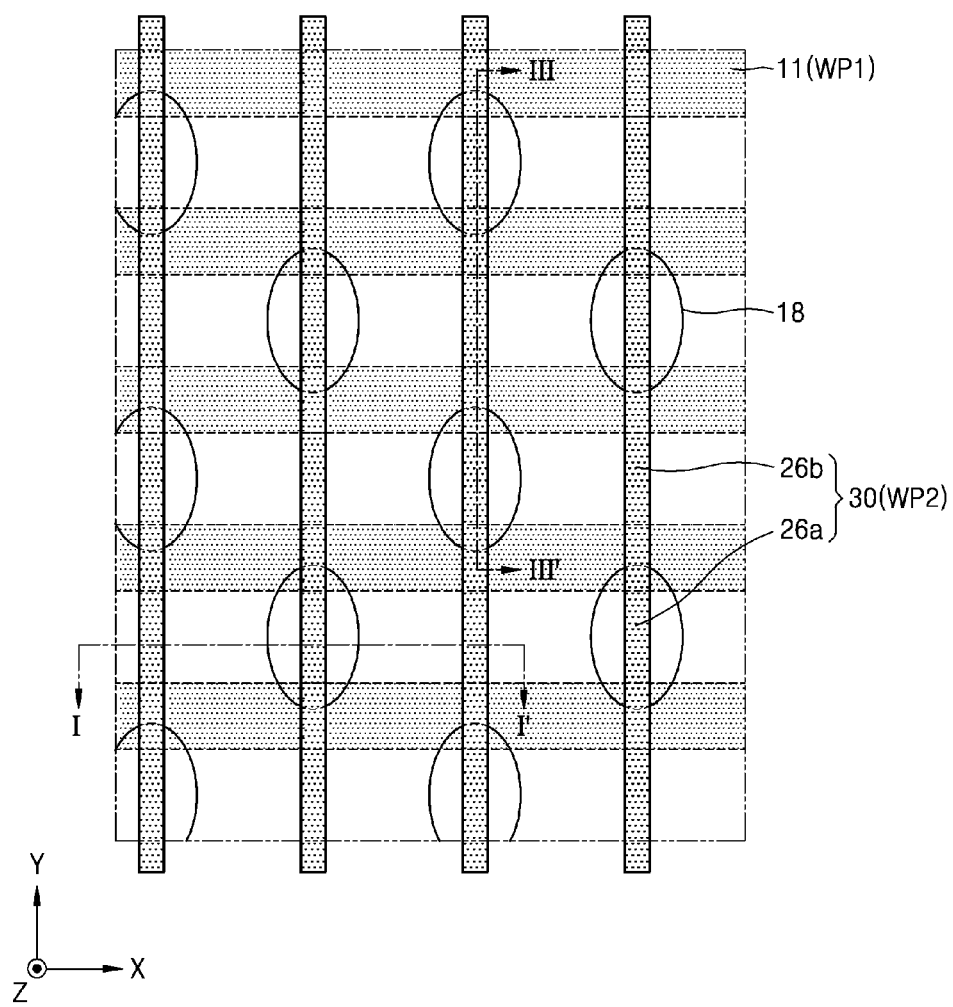

In FIGS. 7A through 7C, the capping layer 25b, the third wiring layer 25a, and the wiring layer 24-1 are etched to form the second wiring line patterns WP2 including the double wiring line pattern 30 and the capping pattern 29 on the support layer 10, using photolithography and etching processes. Here, an operation of forming the second wiring line patterns WP2 will be described in detail.

A mask pattern 32 having a relatively short length in the first direction and a relatively long length in the second direction is formed on the capping layer 25b. The mask pattern 32 may be a photoresist pattern formed using photolithography and etching processes. For example, the mask pattern 32 may be formed by forming a photoresist layer (not shown) on the capping layer 25b and then exposing and developing the photoresist layer.

Next, the capping layer 25b, the third wiring layer 25a, and the wiring layer 24-1 may be etched using the mask pattern 32 as an etching mask, thereby forming the second wiring line patterns WP2 including the capping pattern 29 and the double wiring line pattern 30.

When forming the second wiring line patterns WP2, due to the second protection layer 13-1, the first protection layer 12-2 may not be overly etched. In particular, when forming the second wiring line patterns WP2, due to the second protection layer 13-1, corner portions of two ends of the first protection layer 12-2 may not be overly etched.

Moreover, due to the second protection layer 13-1, a contact pattern 26a to be formed in the first contact hole patterns 18 may be easily formed. When forming the second wiring line patterns WP2, the second protection layer 13-1 may be etched to form the second protection pattern 13. The operation of forming the second protection pattern 13 is described above with reference to FIGS. 2A through 2C and 3C, and thus, description thereof will be omitted here.

The second wiring line patterns WP2 may have a relatively short length in the first direction and a relatively long length in the second direction as illustrated in FIG. 7C. In FIG. 7C, the capping pattern 29 is not illustrated for convenience. The second wiring line patterns WP2 may include a contact pattern 26a (or a contact pattern layer) formed in the first contact hole pattern 18 and a non-contact pattern 26b (or a non-contact pattern layer) formed on the second protection pattern 13 on the support layer 10 where the first contact hole patterns 18 are not formed.

Figure 8A:
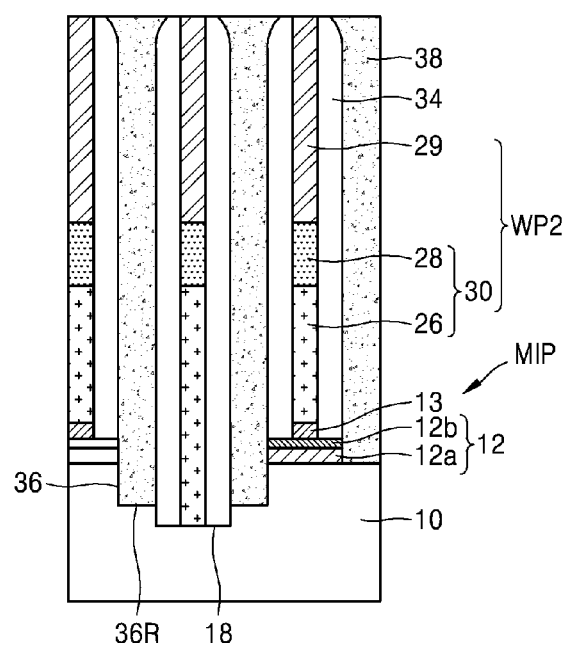
Figure 8B:
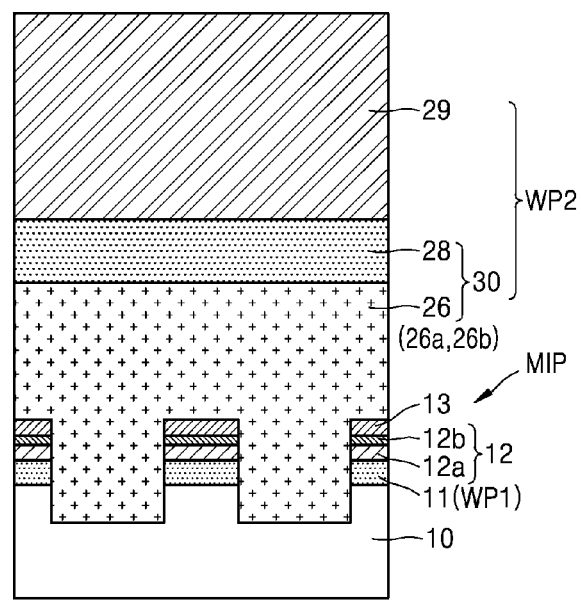
Figure 8C:
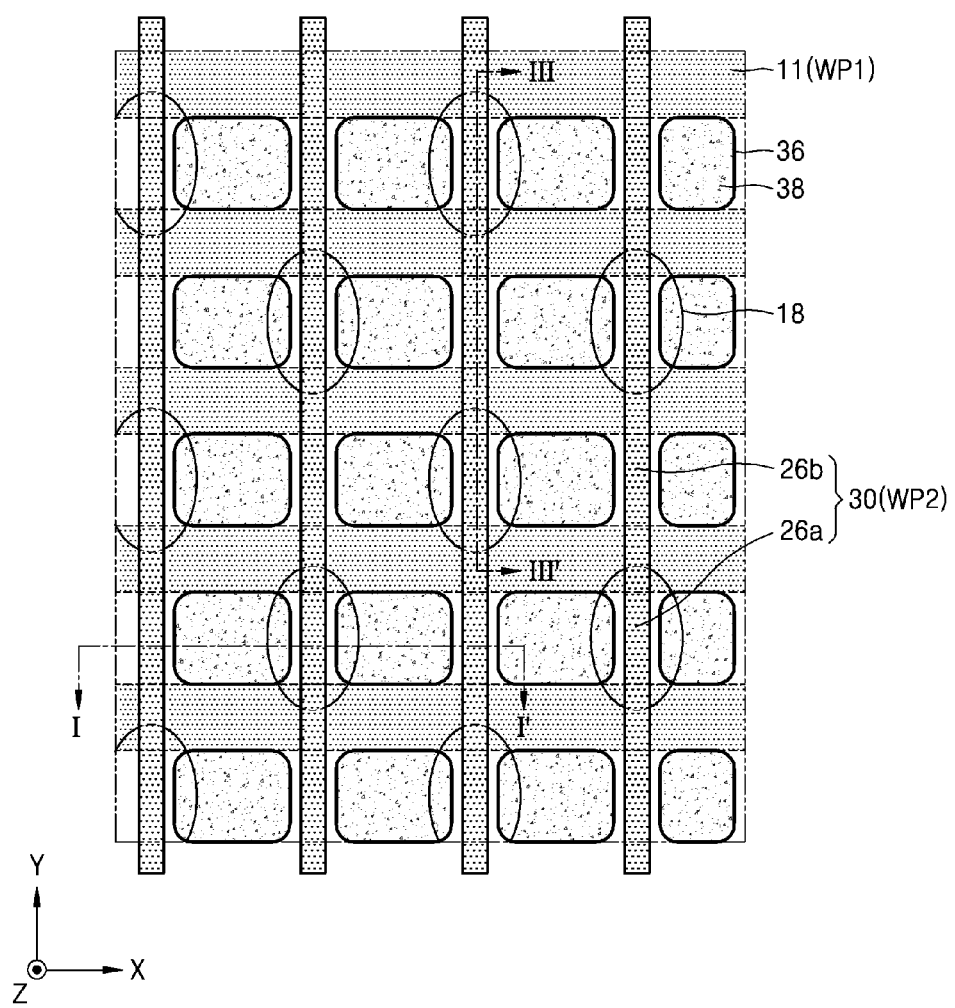

Referring to FIGS. 8A through 8C, a spacer layer 34 is formed on two sides of the second wiring line patterns WP2. Furthermore, the first protection layer 12-2 (FIGS. 7A and 7B) may be etched by using the spacer layer 34 as a mask. When forming the spacer layer 34, the first protection layer 12-2 may be etched to become a first protection pattern 12.

The first protection pattern 12 may include a first silicon oxide pattern 12a and a first silicon nitride pattern 12b formed on the first silicon oxide pattern 12a.

Next, the support layer 10 between the first wiring line patterns WP1 and the second wiring line patterns WP2 is etched using photolithography and etching processes, thereby forming second contact hole patterns 36. The second contact hole patterns 36 are spaced apart from one another two-dimensionally in the first direction and the second direction. The second contact hole patterns 36 may be a recess contact hole pattern 36R that is less etched to become a higher portion of the support layer 10 than the first contact hole pattern 18.

Through the above-described manufacturing operation, a multiple insulation pattern MIP may be formed under the second wiring line patterns WP2 and on an upper surface of the support layer 10. The multiple insulation pattern MIP protects the support layer 10 and may also help to reliably form the second contact hole patterns 36 near the second wiring line patterns WP2. Subsequently, a conductive layer such as a metal layer may be buried in the second contact hole patterns 36 to form a second contact 38.

Hereinafter, an example in which the semiconductor device 500 of FIGS. 1 through 8 is applied to a dynamic random access memory (DRAM) device will be described. However, the scope of inventive concepts is not limited to the embodiment described below.

Figure 9A:
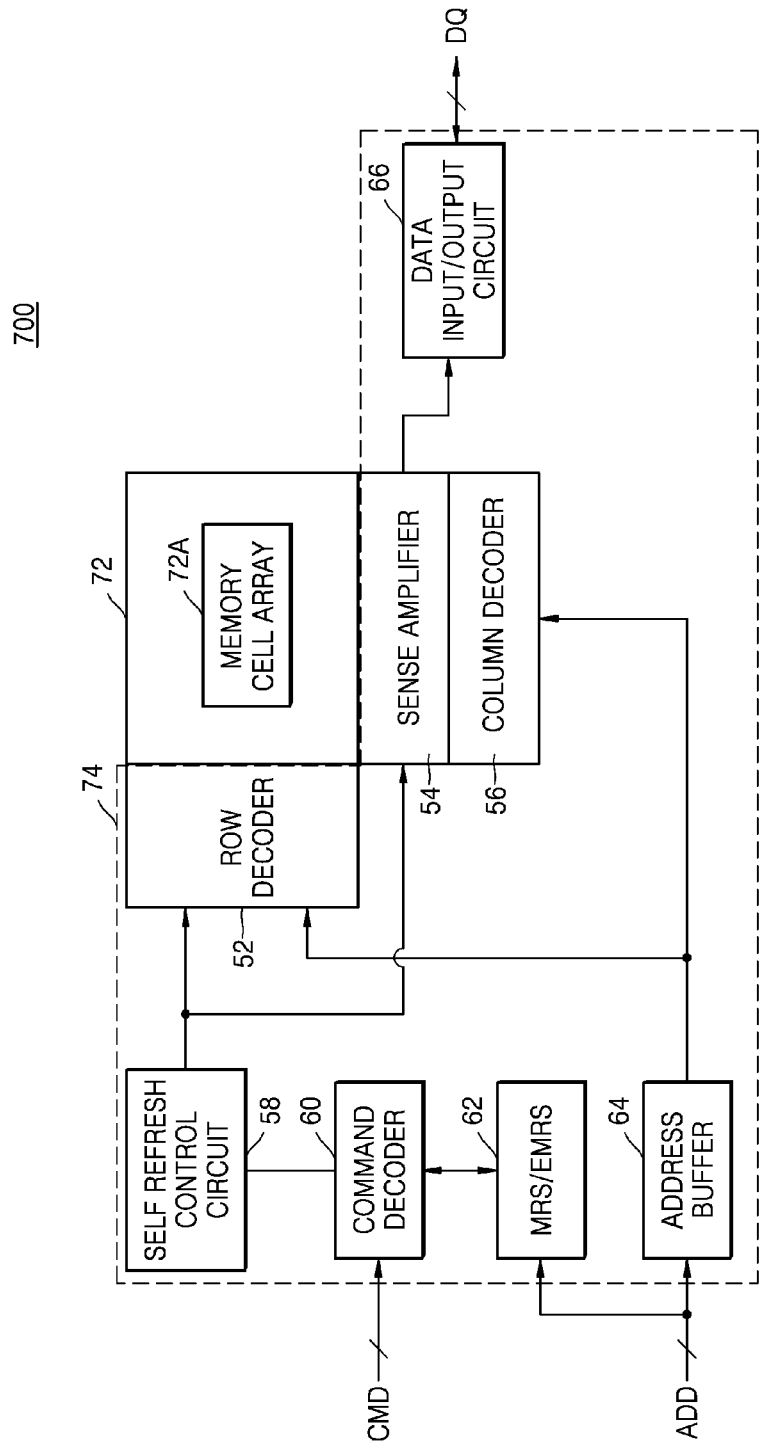
FIG. 9A is a block diagram for describing an example structure of a semiconductor device formed of a dynamic random access memory (DRAM) device, according to some example embodiments of inventive concepts.

FIG. 9A is a block diagram for describing an example structure of a semiconductor device 700 according to some example embodiments of inventive concepts.

In detail, the semiconductor device 700 may be a DRAM device. The semiconductor device 700 may include a memory cell array region 72 and a peripheral circuit region 74. The memory cell array region 72 may include a memory cell array 72A. In the memory cell array 72A, a plurality of memory cells for storing data may be arranged in a row direction and a column direction. The plurality of memory cells may each include a cell capacitor and an access transistor.

A gate of the access transistor may be connected to a corresponding word line from among a plurality of word lines arranged in the row direction, and one of a source and a drain of the access transistor may be connected to a bit line or a complementary bit line arranged in the column direction, and the other of the source and the drain may be connected to the cell capacitor.

The peripheral circuit region 74 may include a row decoder 52, a sense amplifier 54, a column decoder 56, a self-refresh control circuit 58, a command decoder 60, a Mode Register Set/Extended Mode Register Set (MRS/EMRS) circuit 62, an address buffer 64, and a data input/output circuit 66. The sense amplifier 54 may sense and amplify data of a memory cell and store the data in the memory cell. The sense amplifier 54 may be implemented by a cross-coupled amplifier connected between a bit line and a complementary bit line included in the memory cell array 72A.

Data DQ input through the data input/output circuit 66 may be written to the memory cell array 72A based on an address signal ADD, and the data DQ read from the memory cell array 72A based on an address signal ADD may be output to the outside through the data input/output circuit 66. An address signal ADD may be input to the address buffer 64 to designate a memory cell to or from which data is to be written or read. The address buffer 64 may temporarily store an address signal ADD input from the outside.

The row decoder 52 may decode a row address from among address signals ADD output from the address buffer 64 in order to designate a word line connected to a memory cell, to or from which data is to be input or output. That is, in a data write mode or a data read mode, the row decoder 52 may decode a row address output from the address buffer 64 and enable a corresponding word line. Also, in a self-refresh mode, the row decoder 52 may decode a row address generated from an address counter and enable a corresponding word line.

The column decoder 56 may decode a column address from among address signals ADD output from the address buffer 64 in order to designate a bit line connected to a memory cell, to or from which data is to be input or output. Data may be output from or written to a memory cell designated by row and column addresses via the memory cell array 72A.

The command decoder 60 may receive a command signal CMD applied from the outside, and may decode the signal to internally generate a decoded command signal such as a self-refresh entry command or a self-refresh exit command. The MRS/EMRS circuit 62 may set an internal mode register in response to an MRS/EMRS command and an address signal ADD to designate an operation mode of the semiconductor device 700. Although not illustrated in FIG. 9A, the semiconductor device 700 may further include a clock circuit that generates a clock signal or a power circuit that receives a power voltage applied from the outside to generate or distribute the internal voltage, or the like.

The self-refresh control circuit 58 may control a self-refresh operation of the semiconductor device 700 in response to a command output from the command decoder 60. The command decoder 60 may include an address counter, a timer, and a core voltage generator. In response to a self-refresh entry command output from the command decoder 60, the address counter may generate a row address for designating a row address to self-refresh, and apply the row address to the row decoder 52. The address counter may stop a counting operation in response to a self-refresh exit command output from the command decoder 60.

Figure 9B:
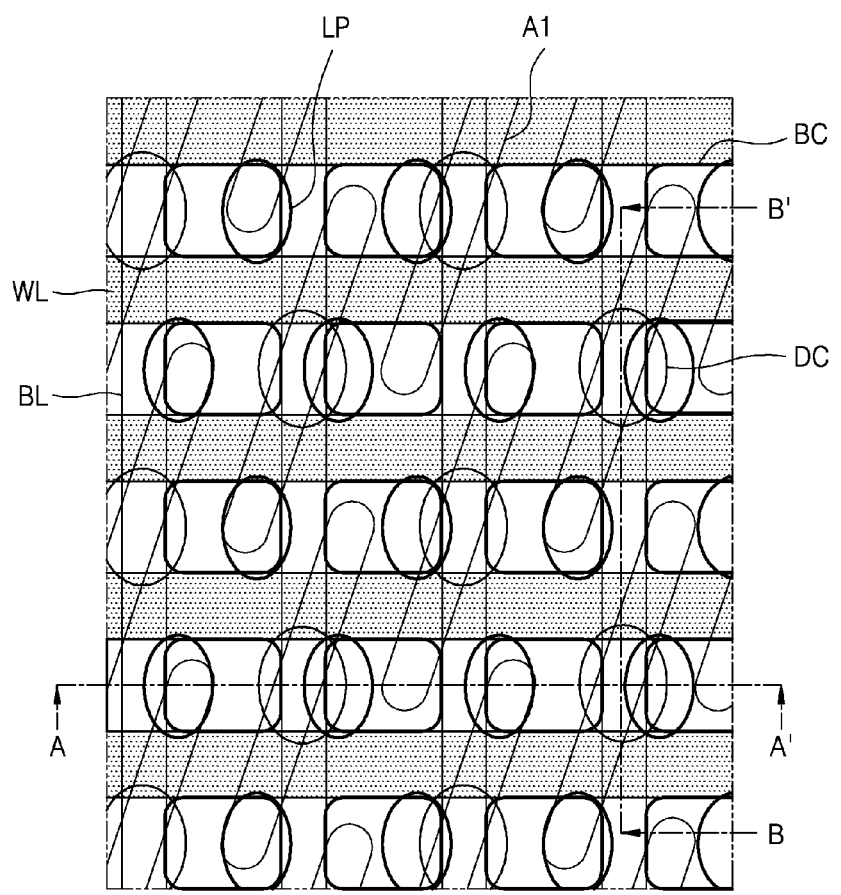
FIGS. 9B and 9C are schematic plan views for explaining major structures of a memory cell array region and a peripheral circuit region illustrated in FIG. 9A.
Figure 9C:
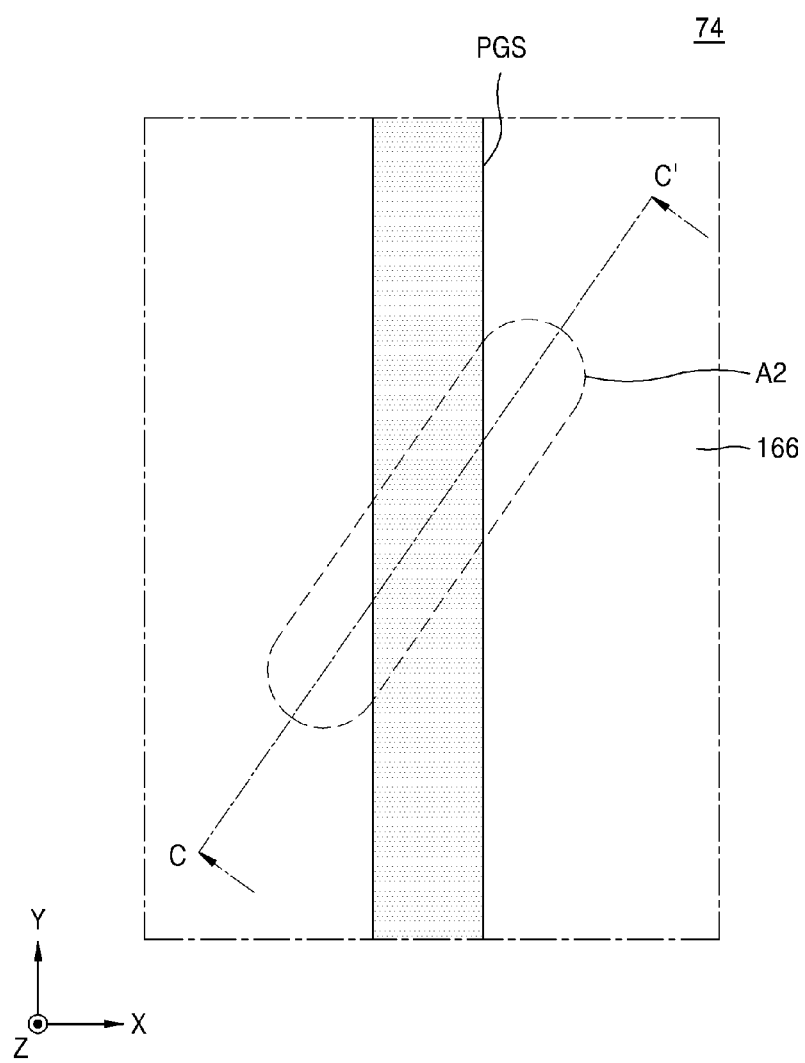

FIGS. 9B and 9C are schematic plan views for explaining major structures of a memory cell array region 72 and a peripheral circuit region 74 illustrated in FIG. 9A.

In detail, the memory cell array region 72 may include a plurality of cell active regions A1. The plurality of cell active regions A1 may be arranged to have a long axis in a diagonal direction with respect to a first direction (X direction) and a second direction (Y direction).

A plurality of word lines WL may extend in parallel to each other across the plurality of cell active regions A1 and in the first direction (X direction). A plurality of bit lines BL may extend in parallel to each other above the plurality of word lines WL in the second direction (Y direction) crossing the first direction (X direction). The plurality of bit lines BL may be connected to the plurality of cell active regions A1 via direct contacts DC.

A plurality of buried contacts BC may be formed between two adjacent bit lines BL from among the plurality of bit lines BL. The plurality of buried contacts BC may be arranged in a series in the first direction (X direction) and the second direction (Y direction). A plurality of landing pads LP may be formed on the plurality of buried contacts BC. The plurality of buried contacts BC and the plurality of landing pads LP may be used to connect a bottom electrode (not shown) of a capacitor that is formed on the plurality of bit lines BL, to the cell active regions A1. The plurality of landing pads LP may be arranged to each partially overlap with the buried contacts BC.

The peripheral circuit region 74 may include a peripheral circuit active region A2. The peripheral circuit active region A2 may be arranged to have a long axis in a diagonal direction with respect to the first direction (X direction) and the second direction (Y direction). A peripheral circuit gate structure PGS may be disposed across the peripheral circuit active region A2. The peripheral circuit gate structure PGS may be a peripheral circuit gate line. The peripheral circuit gate structure PGS may include a metal gate. The peripheral circuit gate structure PGS may be insulated via an interlayer insulation layer 166.

FIGS. 10 through 20 are cross-sectional views for explaining a method of manufacturing a semiconductor device according to some example embodiments of inventive concepts, and the semiconductor device manufactured according to the method. FIGS. 10 through 20 are provided to describe an example manufacturing method of a DRAM device and the DRAM device manufactured according to the method. The semiconductor device 700 according to inventive concepts is not limited to the manufacturing method of FIGS. 10 through 20.

FIGS. 10 through 20 illustrate cross-sectional structures of a cell array region CELL, a peripheral circuit region CORE/PERI, and an interface region INTERFACE. The cell array region CELL may be a portion of the memory cell array region 72 of FIGS. 9A and 9B described above. The peripheral circuit region CORE/PERI may be a portion of the peripheral circuit region 74 of FIGS. 9A and 9C. The interface region INTERFACE may be a portion of a region between the cell array region CELL and the peripheral circuit region CORE/PERI.

In FIGS. 10 through 20, a cross-sectional structure marked by (A) may correspond to a partial region of a cross-section cut along a line A-A' of FIG. 9B. A cross-sectional structure marked by (B) may correspond to a partial region of a cross-section cut along a line B-B' of FIG. 9B and a portion of the interface region INTERFACE adjacent thereto. A cross-sectional structure marked by (C) may correspond to a partial region of a cross-section cut along a line C-C' of FIG. 9C.

Figure 10:
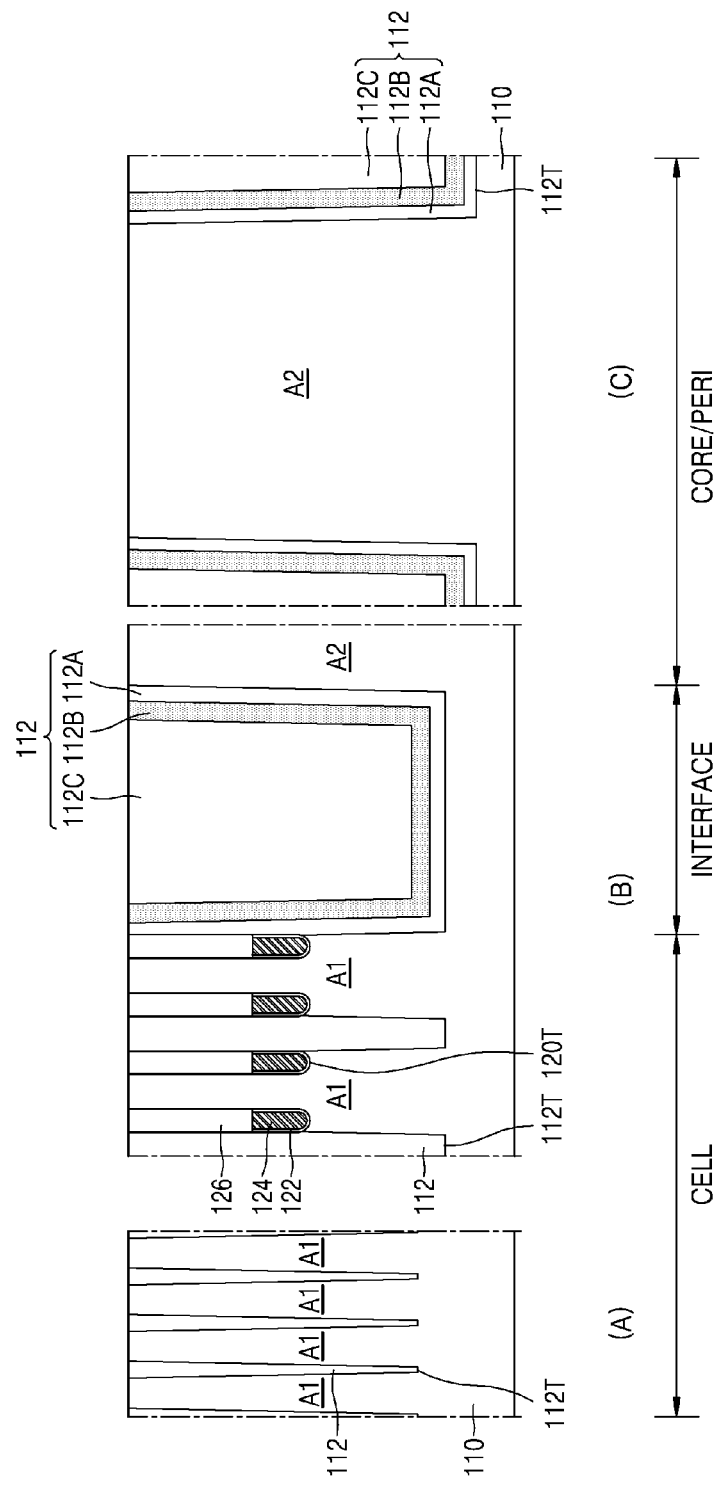
FIGS. 10 through 20 are cross-sectional views for explaining a method of manufacturing a semiconductor device according to some example embodiments of inventive concepts, and the semiconductor device manufactured according to the method.

Referring to FIG. 10, a substrate 110 having a cell array region CELL, a peripheral circuit region CORE/PERI, and an interface region INTERFACE therebetween is prepared. After forming a plurality of device isolation trenches 112T in the substrate 110, a plurality of device isolation layers 112 filling the plurality of device isolation trenches 112T are formed.

A plurality of cell active regions A1 are defined in the cell array region CELL in the substrate 110 by the plurality of device isolation layers 112, and a peripheral circuit active region A2 may be defined in the peripheral circuit region CORE/PERI. The plurality of cell active regions A1 may each have a relatively long island-type planar shape having a short axis and a long axis as illustrated in FIG. 9B. The interface region INTERFACE may be defined by a device isolation layer 112 that is disposed between the cell active region A1 and the peripheral circuit active region A2, from among the plurality of device isolation layers 112.

The substrate 110 may include a semiconductor element such as Si or Ge or at least one compound semiconductor selected from the group consisting of SiGe, SiC, GaAs, InAs, and InP. The substrate 110 may include a conductive region such as an impurity-doped well or an impurity-doped structure. The device isolation layer 112 may include a silicon oxide layer, a silicon nitride layer or a combination thereof, but is not limited thereto. The device isolation layer 112 may include a single layer formed of one type of insulating layer, or a dual layer formed of two types of insulating layers, or a multi-layer formed of a combination of at least three types of insulating layers.

In the peripheral circuit region CORE/PERI and the interface region INTERFACE, the device isolation layer 112 may include a first insulation liner 112A and a second insulation liner 112B sequentially formed on an internal wall of the device isolation trench 112T, and a buried insulating layer 112C filling the device isolation trench 112T on the second insulation liner 112B. In some embodiments, the first insulation liner 112A may include a silicon oxide layer, the second insulation liner 112B may include a silicon nitride layer, and the buried insulating layer 112C may include a silicon oxide layer.

In some embodiments, a silicon oxide layer forming the first insulation liner 112A may be a medium temperature oxidation (MTO) layer, a high density plasma (HDP) oxide layer, a thermal oxide layer, a tetrathylorthosilicate (TEOS) layer, or an undoped silicate glass (USG) layer. The second insulation liner 112B may be a silicon nitride layer. In some embodiments, a silicon oxide layer forming the buried insulating layer 112C may be a tonen silazane (TOSZ), a HDP oxide layer or a USG oxide layer. In other embodiments, a silicon oxide layer forming the buried insulating layer 112C may be silicate, siloxane, methyl silsesquioxane (MSQ), hydrogen silsesquioxane (HSQ), polysilazane, or a spin-on-glass (SOG) oxide layer including a combination thereof.

In the cell array region CELL, a plurality of word line trenches 120T extending in parallel to each other may be formed in the substrate 110. After cleaning a resultant product in which the plurality of word line trenches 120T are formed, a gate dielectric layer 122, a word line 124, and a buried insulating layer 126 may be sequentially formed in each of the plurality of word line trenches 120T. The gate dielectric layer 122, the word line 124, and the buried insulating layer 126 may form a word line structure WLS. The plurality of word lines 124 may be the plurality of word lines WL illustrated in FIG. 9B.

A plurality of source/drain regions may be formed on an upper surface of the plurality of cell active regions A1 by injecting impurity ions into both portions of the plurality of word lines 124 in the plurality of cell active regions A1. In some embodiments, the source/drain regions may also be formed before forming the plurality of word lines 124.

The gate dielectric layer 122 may include a silicon oxide layer, a silicon nitride layer, a silicon oxy-nitride layer, an oxide/nitride/oxide (ONO) layer, or a high-k dielectric film having a higher dielectric constant than a silicon oxide layer. For example, the gate dielectric layer 122 may have a dielectric constant of about 10 to about 25.

In some embodiments, the gate dielectric layer 122 may include $HfO_2$, $Al_2O_3$, $HfAlO_3$, $Ta_2O_3$, or $TiO_2$. The word line 124 may be formed of Ti, TiN, Ta, TaN, W, WN, TiSiN, WSiN, or a combination thereof. The buried insulating layer 126 may include a silicon oxide layer, a silicon nitride layer, a silicon oxy-nitride layer or a combination thereof.

Figure 11:
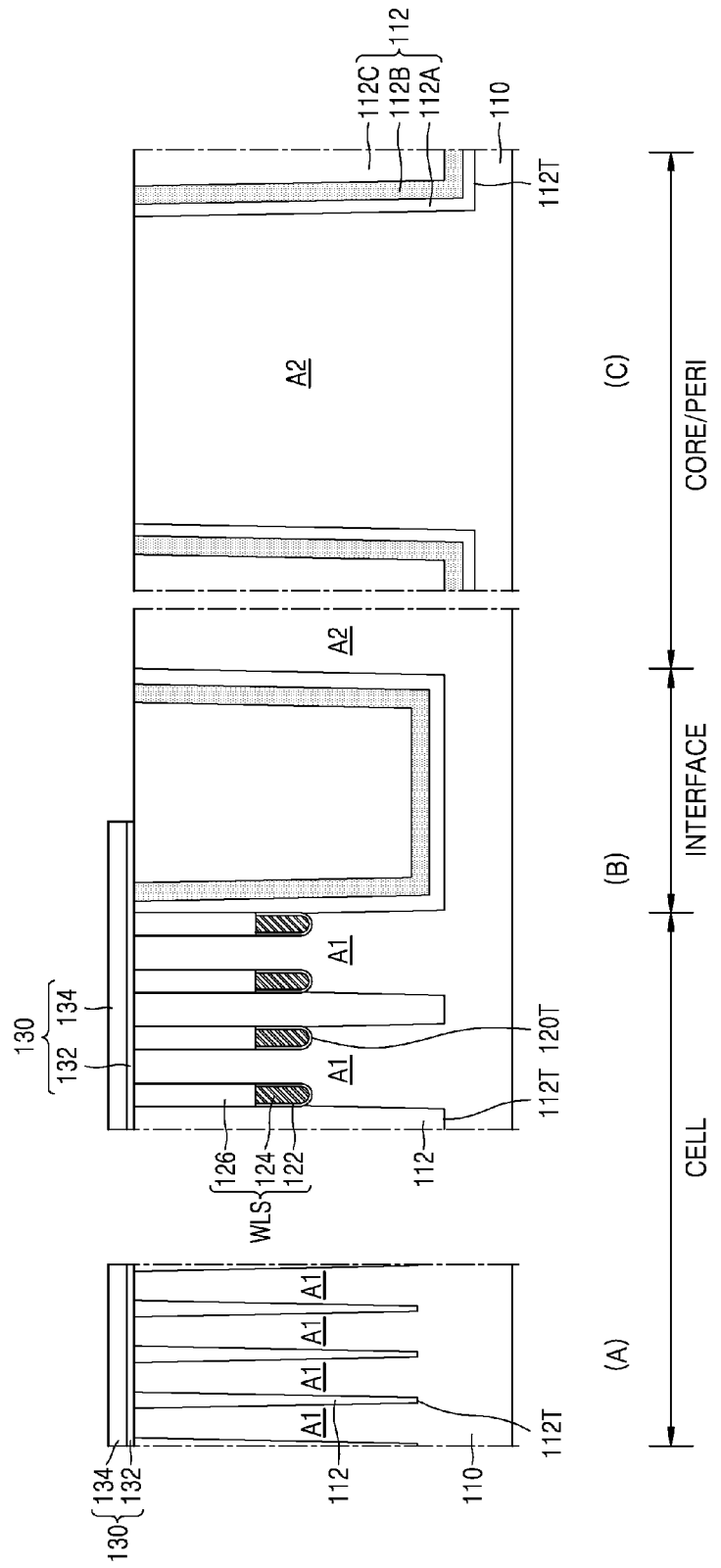

Referring to FIG. 11, a first protection layer 130 is formed on the substrate 110 in the cell array region CELL, the interface region INTERFACE, and the peripheral circuit region CORE/PERI. The first protection layer 130 may be an insulating layer. For example, the first protection layer 130 may include a first silicon oxide layer 132 and a first silicon nitride layer 134 sequentially formed on the substrate 110.

The first protection layer 130 may be formed by first forming an insulating layer (not shown) on the entire surfaces of the cell array region CELL, the interface region INTERFACE, and the peripheral circuit region CORE/PERI, and then removing a portion of the insulating layer formed in the interface region INTERFACE and the peripheral circuit region CORE/PERI. As a result, the first protection layer 130 may be left to cover the cell array region CELL and a portion of the interface region INTERFACE adjacent to the cell array region CELL. In some embodiments, to remove a portion of the insulating layer formed in the interface region INTERFACE and the peripheral circuit region CORE/PERI, a dry etching method, a wet etching method or a combination thereof may be used. After the first protection layer 130 is formed, an upper surface of the peripheral circuit active region A2 may be exposed in the peripheral circuit region CORE/PERI.

Figure 12:
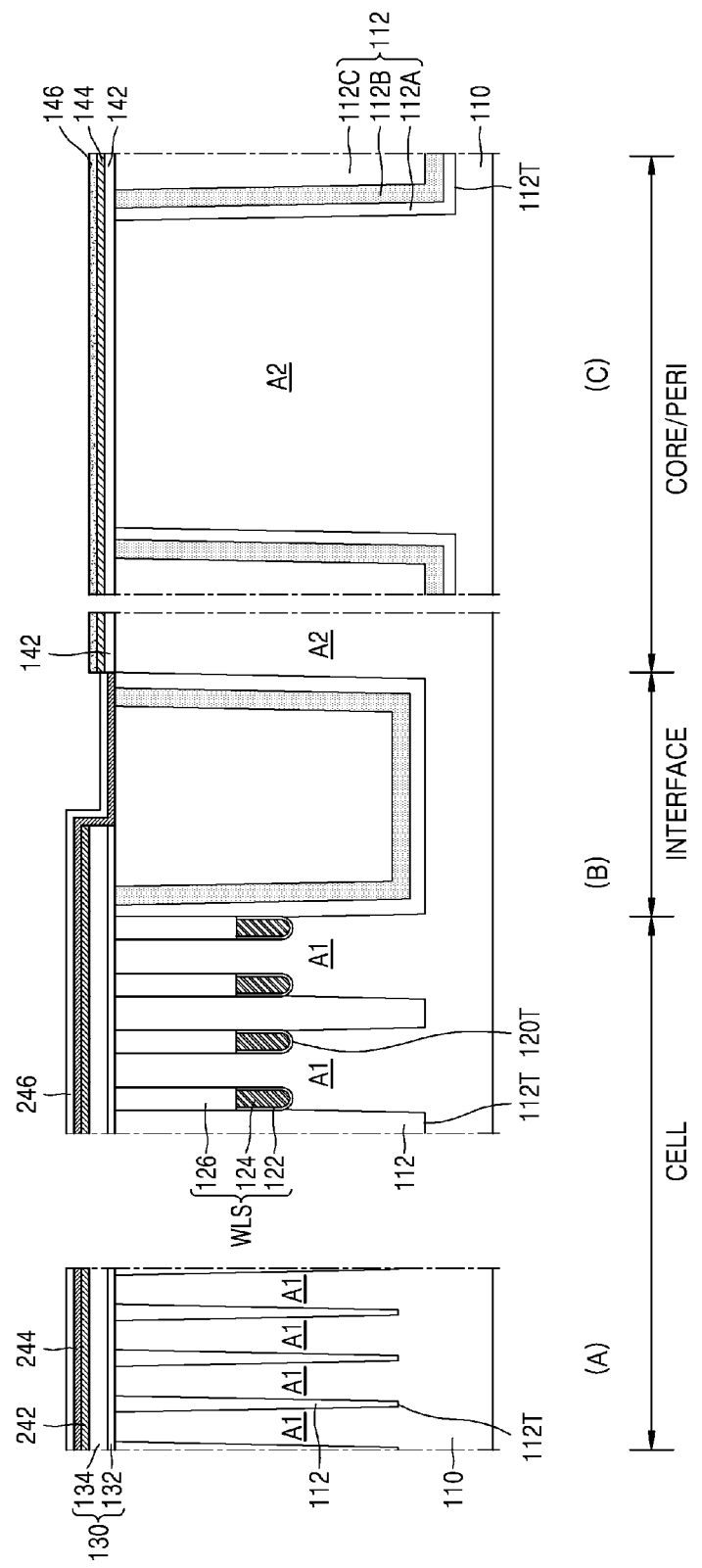

Referring to FIG. 12, a second protection layer 242 is formed on the first protection layer 130 in the cell array region CELL and the interface region INTERFACE. The second protection layer 242 may correspond to the second protection layer 13-1 of FIG. 3B. The second protection layer 242 may be an oxide layer or an oxy-nitride layer. The second protection layer 242 may be formed using a thermal growth method instead of a deposition method. The second protection layer 242 may be a thermal oxide growth layer or a thermal oxy-nitride growth layer.

A first dielectric layer 142 is formed in the peripheral circuit region CORE/PERI. In some example embodiments, the first dielectric layer 142 may be formed using a thermal growth method. In some example embodiments, the first dielectric layer 142 may be formed of the same layer material as that of the second protection layer 242, for example, as a thermal oxide growth layer or a thermal oxy-nitride growth layer. In some example embodiments, the first dielectric layer 142 may include, for example, an oxide layer, a nitride layer, an oxy-nitride layer, or an oxide/nitride/oxide (ONO) layer.

Second dielectric layers 244 and 144 and metal-containing work function controlling layers 246 and 146 are sequentially formed on the substrate 110 in the cell array region CELL, the interface region INTERFACE, and the peripheral circuit region CORE/PERI.

Figure 13:
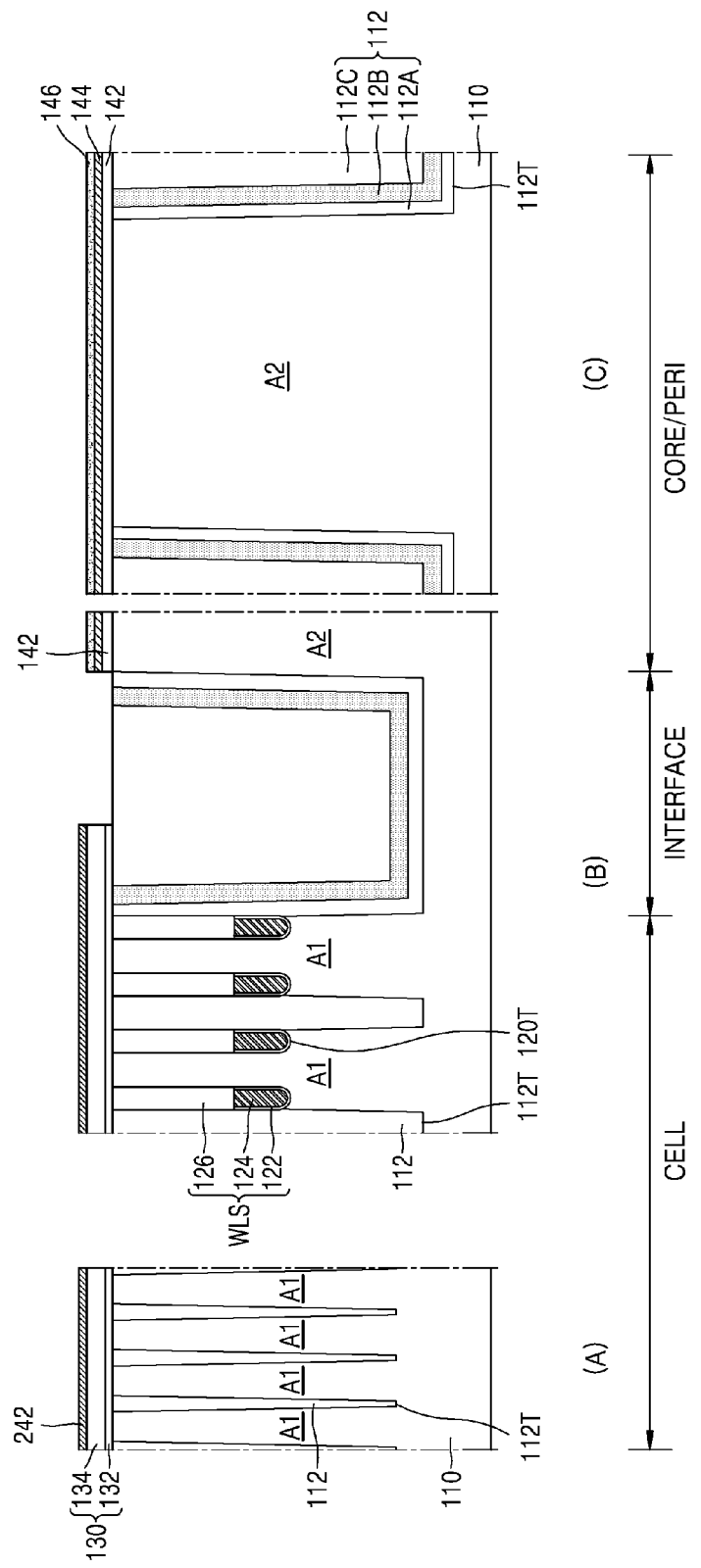

Referring to FIG. 13, the second dielectric layer 244 and the metal-containing work function controlling layer 246 formed in the cell array region CELL and the interface region INTERFACE are removed. Accordingly, the first dielectric layer 142, the second dielectric layer 144, and the metal-containing work function controlling layer 146 may be formed in the peripheral circuit region CORE/PERI.

The second dielectric layer 144 formed in the peripheral circuit region CORE/PERI may include a high-k dielectric layer having a dielectric constant higher than a silicon oxide layer. The second dielectric layer 144 may have a higher dielectric constant than the first dielectric layer 142. The second dielectric layer 144 may include a metal-containing oxide layer having a dielectric constant of about 10 to about 25. For example, the second dielectric layer 144 may be formed of $HfO_2$, $Al_2O_3$, $HfAlO_3$, $Ta_2O_3$, or $TiO_2$.

The metal-containing work function controlling layer 146 may be formed of a metal, a conductive metal nitride, a conductive metal carbide, a conductor containing a metal atom, or a combination thereof. The metal-containing work function controlling layer 146 may have a single-layer or multi-layer structure. The metal-containing work function controlling layer 146 may include at least one material selected from Ti, Ta, Al, Ni, Co, La, Pd, Nb, Mo, Hf, Ir, Ru, Pt, Yb, Dy, Er, Pd, TiAl, HfSiMo, TiN, WN, TaN, RuN, MoN, TiAlN, TaC, TiC, and TaC.

In some embodiments, the metal-containing work function controlling layer 146 may be formed of at least one stack structure selected from TiN/TaN, AL$_2$O$_3$/TiN, Al/TiN, TiN/Al/TIN, TIN/TiON, Ta/TiN, TaN/TiN, La/TiN, Mg/TiN, and Sr/TiN. Here, TiN may be replaced by TaN, TaCN, TiCN, CoN, or CoCN, and La may be replaced by LaO or LaON.

Figure 14:
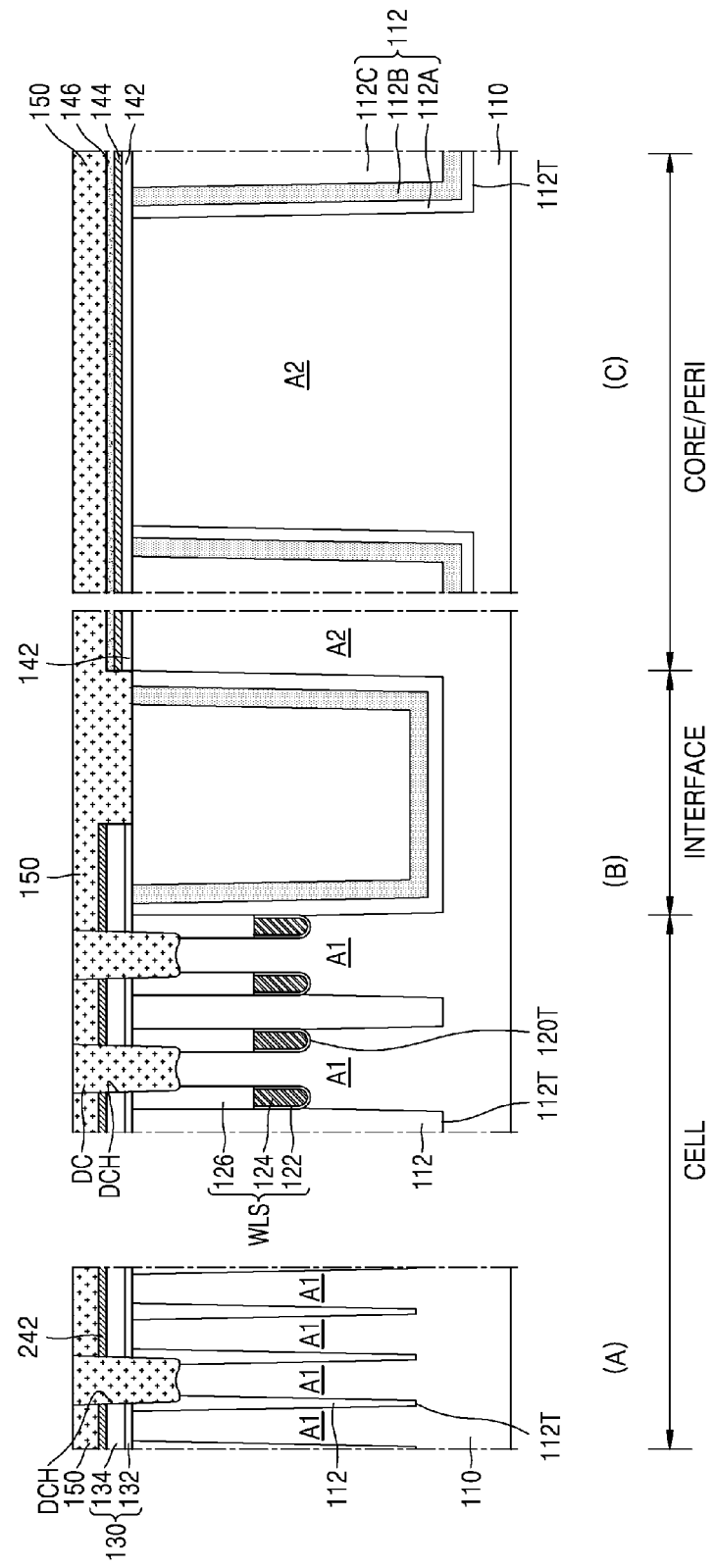

Referring to FIG. 14, in the cell array region CELL, the interface region INTERFACE, and the peripheral circuit region CORE/PERI, a first conductive layer 150 is formed on the substrate 110. Next, in the cell array region CELL, a portion of each of the first conductive layer 150, the second protection layer 242, and the first protection layer 130 and a portion of the substrate 110 are etched to form a plurality of direct contact hole patterns DCH that pass through the first conductive layer 150, the second protection layer 242, and the first protection layer 130 to expose the cell active region A1. Next, the plurality of direct contact hole patterns DCH are filled with a conductive layer (not shown) and etch-backed to form a plurality of direct contacts DC.

According to some example embodiments, the first conductive layer 150 may be formed of a doped polysilicon or a metal such as W, Mo, Au, Cu, Al, Ni, or Co. The first conductive layer 150 may be a single layer formed of one material selected from the above-described materials, or a multi-layer formed of at least two types of the above-described materials. The direct contacts DC may be formed of a doped polysilicon or a metal such as W, Mo, Au, Cu, Al, Ni, or Co.

In some embodiments, the direct contacts DC may be formed of the same material as that of the first conductive layer 150. In some embodiments, a metal silicide layer (not shown) may be further formed between the substrate 110 and the direct contacts DC. For example, the metal silicide layer may be formed of a tungsten silicide, a nickel silicide, or a cobalt silicide, but is not limited thereto.

Figure 15:
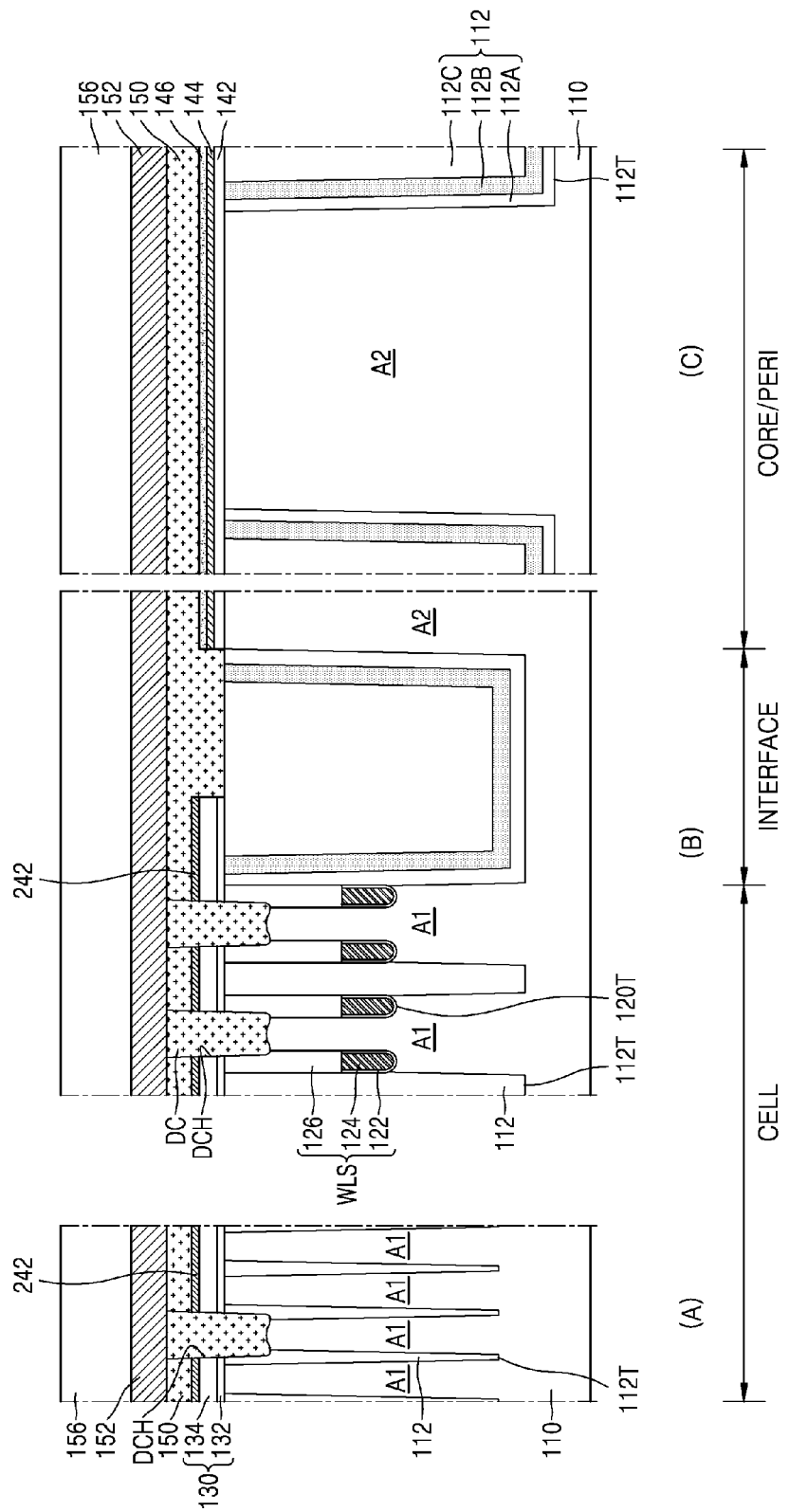

Referring to FIG. 15, a second conductive layer 152 and a capping layer 156 are sequentially formed on the first conductive layer 150 in the cell array region CELL, the interface region INTERFACE, and the peripheral circuit region CORE/PERI.

The second conductive layer 152 may be formed of TiSiN, TiN, TaN, CoN, a metal, a metal silicide, or a combination thereof. The metal and the metal silicide may include W, Mo, Au, Cu, Al, Ni, or Co. The capping layer 156 may include a nitride layer.

Figure 16:
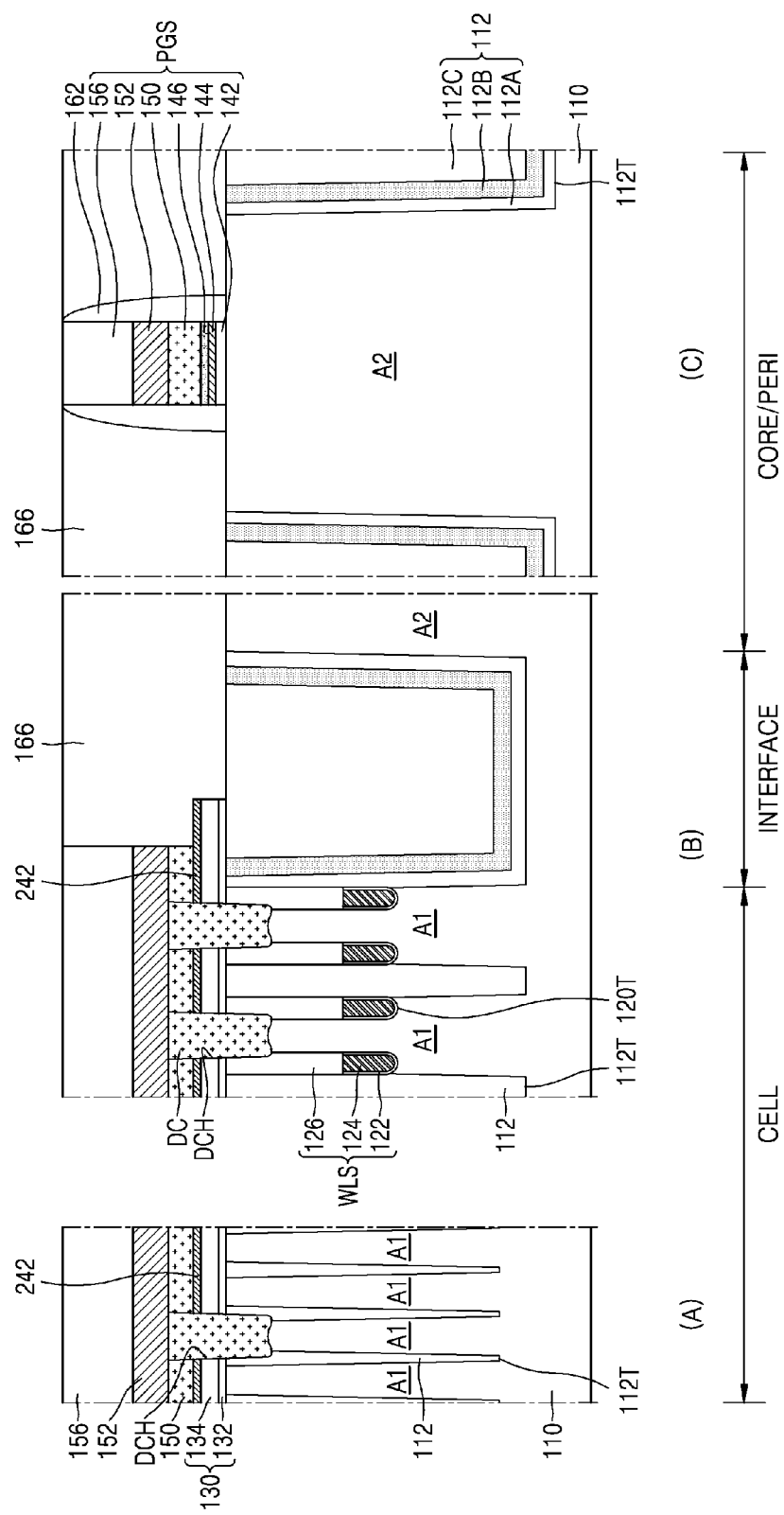

Referring to FIG. 16, while the cell array region CELL and a portion of the interface region INTERFACE adjacent thereto are protected using a mask pattern (not shown), a peripheral circuit stack structure including the first dielectric layer 142, the second dielectric layer 144, the metal-containing work function controlling layer 146, the first conductive layer 150, the second conductive layer 152, and the capping layer 156 is etched in the peripheral circuit area CORE/PERI. In this manner, a peripheral circuit gate structure PGS including the first dielectric layer 142, the second dielectric layer 144, the metal-containing work function controlling layer 146, the first conductive layer 150, the second conductive layer 152, and the capping layer 156 which are patterned in the peripheral circuit region CORE/PERI is formed. The peripheral circuit gate structure PGS may include a metal gate.

Next, after forming a spacer layer 162 covering two sidewalls of the peripheral circuit gate structure PGS, an interlayer insulating layer 166 covering the peripheral circuit gate structure PGS and the spacer layer 162 may be formed. The spacer layer 162 may include an oxide layer, a nitride layer, or a combination thereof. The spacer layer 162 may be a single layer or multiple layers. The interlayer insulating layer 166 may be an HDP oxide layer or an oxide layer formed using a flowable CVD (FCVD) method.

Figure 17:
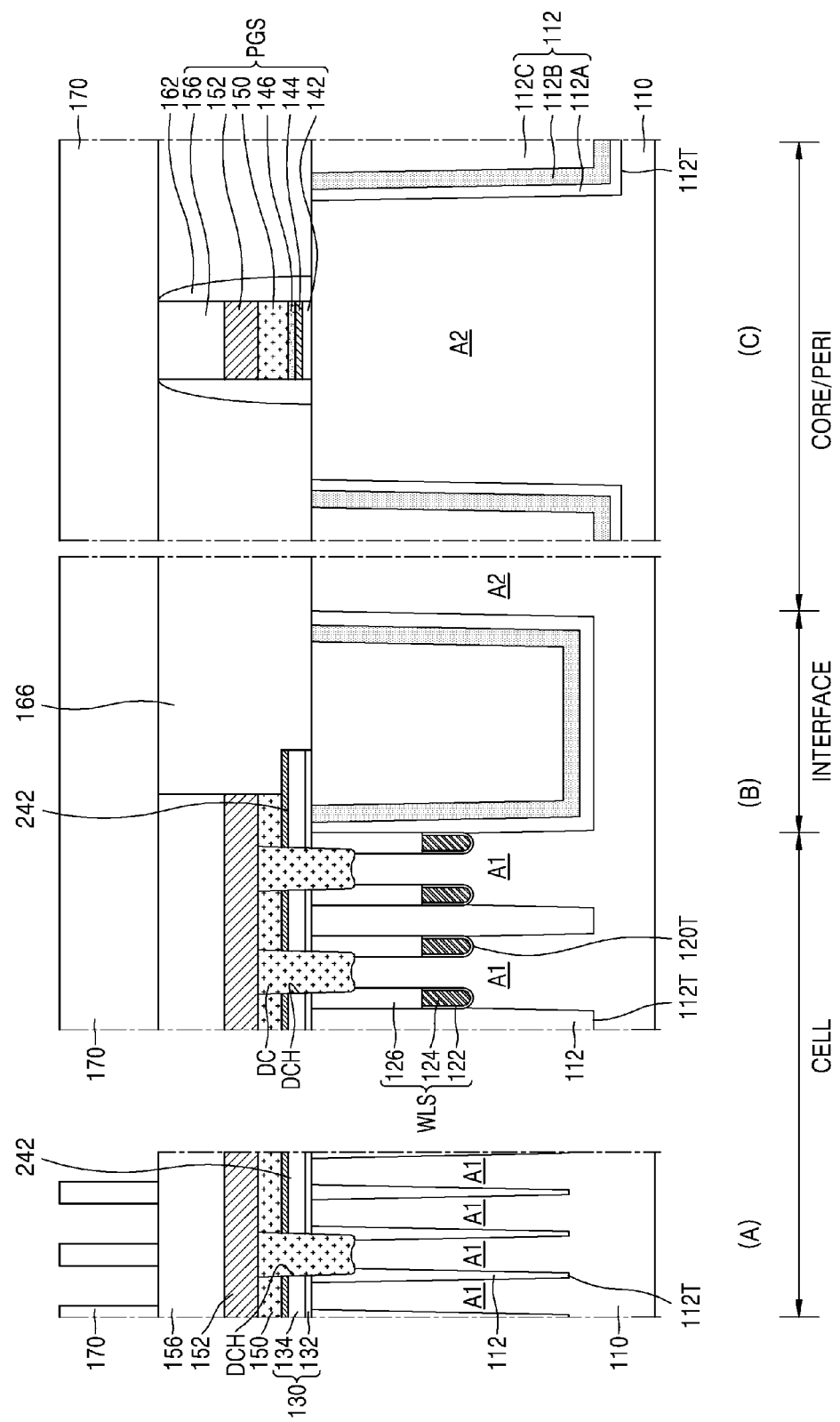
Figure 18:
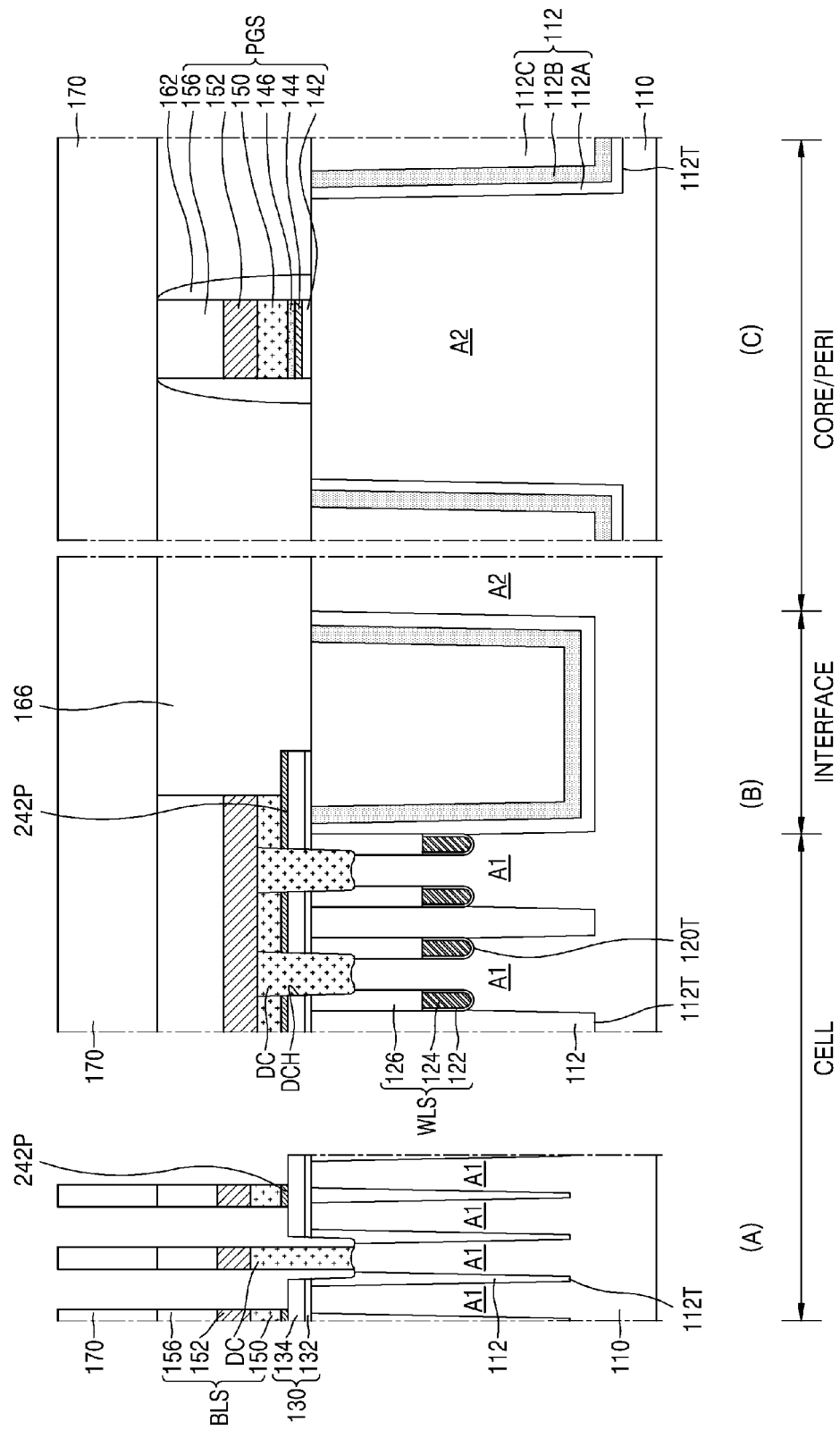

Referring to FIGS. 17 and 18, a mask pattern 170 is formed on the substrate 110. The peripheral circuit region CORE/PERI and the interface region INTERFACE are protected by the mask pattern 170 and an upper surface of the capping layer 156 may be partially exposed in the cell array region CELL. The mask pattern 170 may include a nitride layer.

As illustrated in FIG. 18, a cell stack structure including the direct contact DC, the first conductive layer 150, the second conductive layer 152, and the capping layer 156 in the cell array region CELL is etched using the mask pattern 170 as an etching mask so as to form a plurality of bit line structures BLS in the cell array region CELL.

The first conductive layer 150 and the second conductive layer 152 included in the plurality of bit line structures BLS may form the bit line BL described above. Moreover, when forming the bit line structures BLS, as the second protection layer 242 is etched, a second protection pattern 242P may be formed under the bit line structures BLS. The second protection layer 242 may limit and/or prevent over-etching of the first protection layer 130, and ensure reliable formation of the bit line structures BLS.

Figure 19:
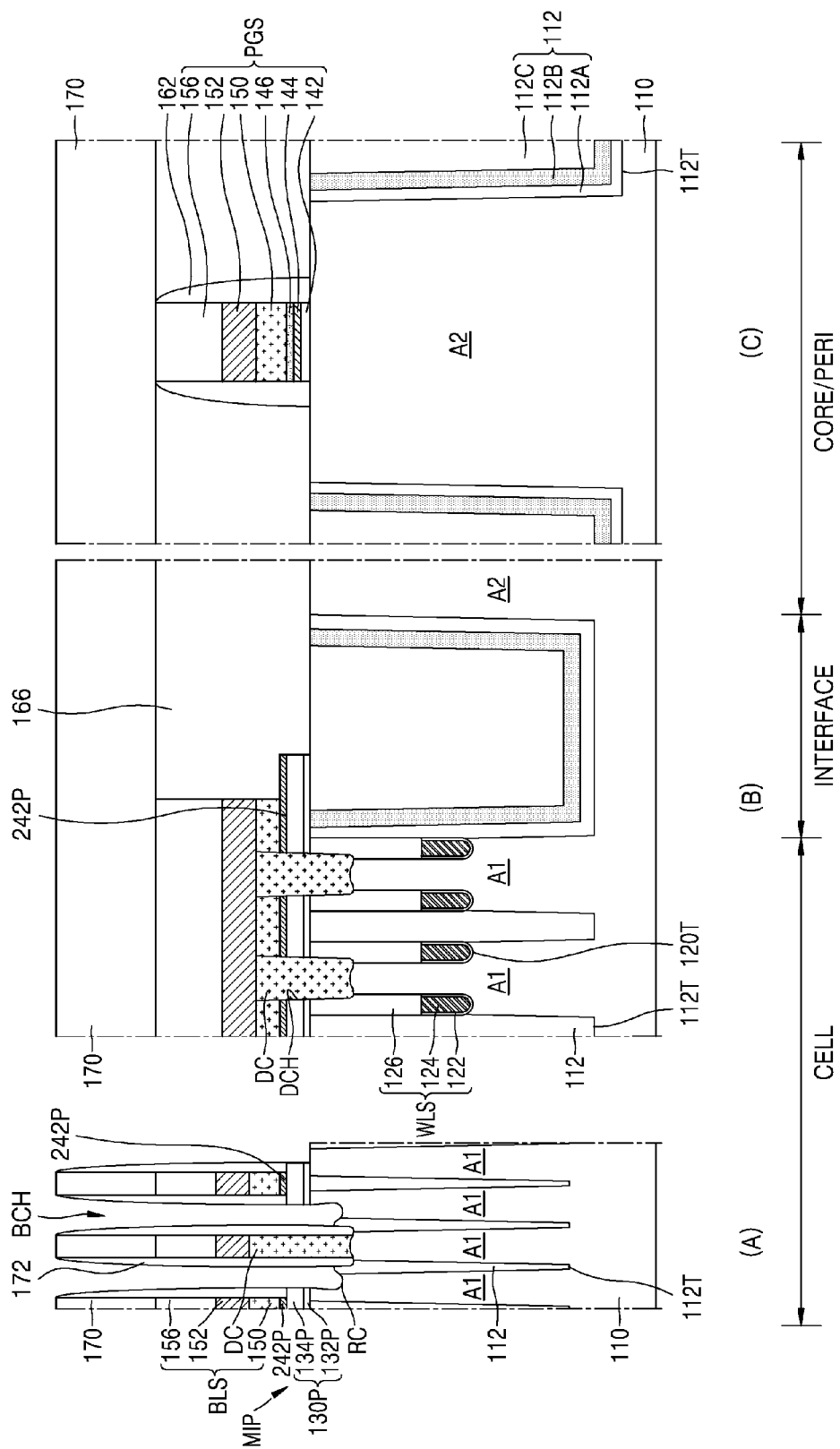

Referring to FIG. 19, a spacer layer 172 covering both sidewalls of each of the plurality of bit line structures BLS in the cell array region CELL is formed, and by using the spacer layer 172 as an etching mask, a portion of the first protection layer 130 exposed through the spacer layer 172, a portion of the substrate 110 and a portion of the device isolation layer 112 are etched to form a plurality of recesses RC exposing the plurality of cell active regions A1.

In order to form the spacer layer 172 and the recesses RC, a spacer insulating layer covering the bit line structures BLS may be formed, and an operation of etch-backing the spacer insulating layer and an operation of etching a portion of the first protection layer 130, a portion of the substrate 110, and a portion of the device isolation layer 112 may be performed.

The plurality of recesses RC may be included in a buried contact hole pattern BCH having a width defined by a pair of spacer layers 172 between two adjacent bit line structures BLS. By including the recess RC, the buried contact hole pattern BCH may be a recess contact hole pattern. When forming the buried contact hole pattern BCH, due to the second protection pattern 242P, the first protection layer 130 may not be overly etched. In addition, when forming the buried contact hole pattern BCH, the first protection layer 130 may be etched to form a first protection pattern 130P. The first protection pattern 130P may include a first silicon oxide pattern 132P and a first silicon nitride pattern 134P.

Through the above-described manufacturing operation, a multiple insulation pattern MIP may be formed under the bit line structure BLS. The multiple insulation pattern MIP may include a first protection pattern 130P formed on the substrate 110 and a second protection pattern 242P formed on the first protection pattern 130P. The multiple insulation pattern MIP may be disposed on an upper surface of the substrate 110 where the direct contact hole patterns DCH (FIG. 17) is not formed and between the word line structures WLS and the bit line structures BLS. Due to the multiple insulation pattern MIP, the substrate 110 may be protected, and the direct contact hole pattern DCH and the buried contact hole pattern BCH may be reliably formed.

Figure 20:
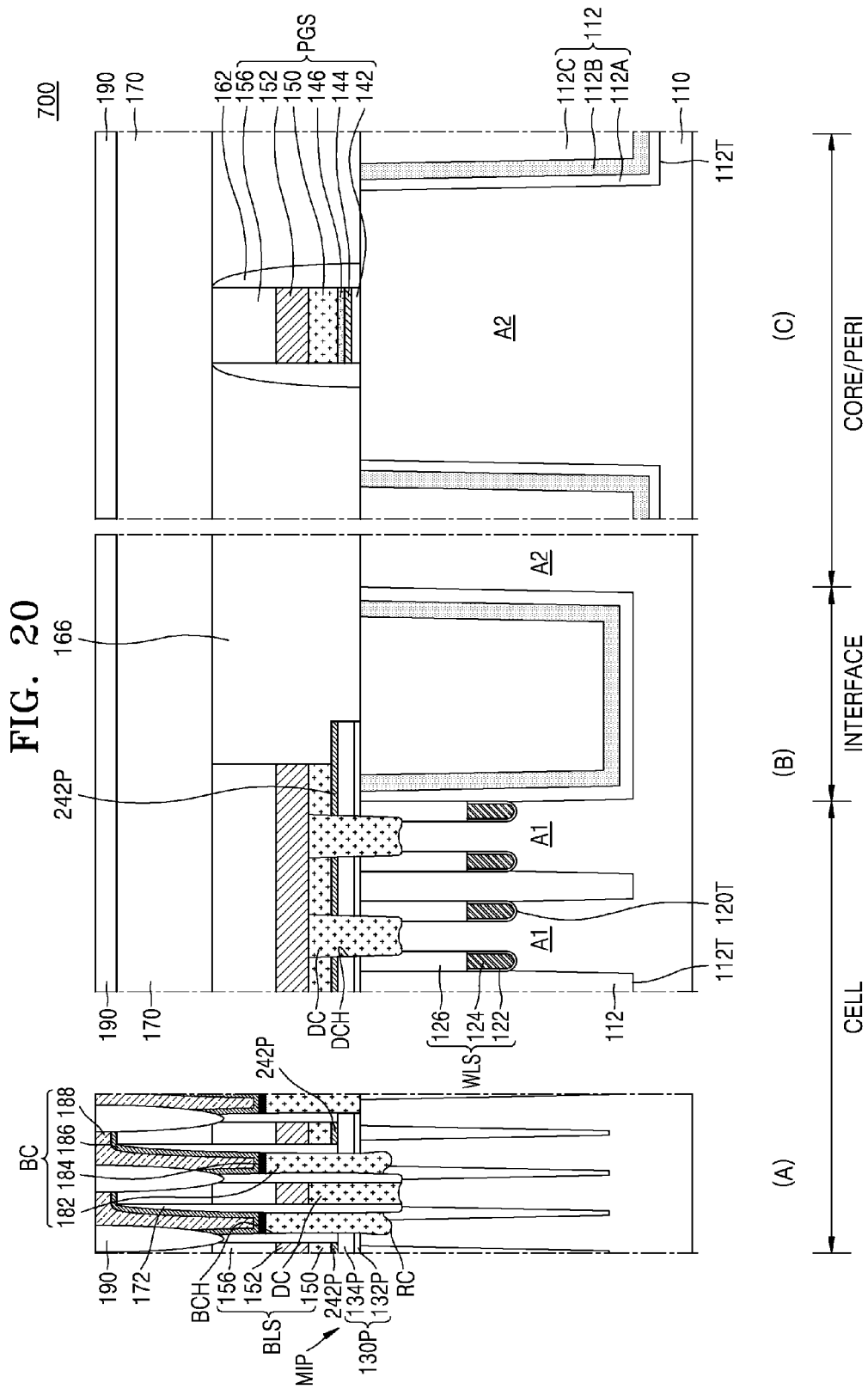

Referring to FIG. 20, a buried conductive layer 182, a metal silicide layer 184, a conductive barrier layer 186, and a conductive layer 188 that fill the recesses RC between the plurality of bit line structures BLS and are sequentially stacked in the buried contact hole pattern BCH are formed. The buried conductive layer 182, the metal silicide layer 184, the conductive barrier layer 186, and the conductive layer 188 may form a buried contact BC (or a buried contact layer).

In addition, portions of the conductive layer 188, which extend on an upper surface of the bit line structure BLS, may be used as a landing pad, to which a bottom electrode of a capacitor formed in a subsequent process may be connected, and may correspond to the plurality of landing pads LP described above with reference to FIG. 9B.

The buried conductive layer 182 may be formed using a CVD process, a PVD process, or an epitaxial growth process. The buried conductive layer 182 may be formed of an impurity-doped semiconductor material, a metal, a conductive metal nitride, a metal silicide, or a combination thereof.

The metal silicide layer 184 may be formed of a cobalt silicide, a nickel silicide, or a manganese silicide. In some embodiments, the metal silicide layer 184 may be omitted. The conductive barrier layer 186 may be formed of a Ti/TiN stack structure. The conductive layer 188 may be formed of a doped polysilicon, a metal, a metal silicide, a conductive metal nitride, or a combination thereof. For example, the conductive layer 188 may include tungsten (W).

While forming the conductive barrier layer 186 and the conductive layer 188 in the cell array region CELL, also in the peripheral circuit region CORE/PERI, contact plugs (not shown) that may be electrically connected to the peripheral circuit active region A2 may be formed. The conductive layers 188 may be electrically insulated from each other via an insulating layer 190 that fills space around the conductive layers 188. Next, in the cell array region CELL, a plurality of capacitor bottom electrodes that are electrically connectable to the conductive layer 188 on the insulating layer 190 may be formed.

Figure 21:
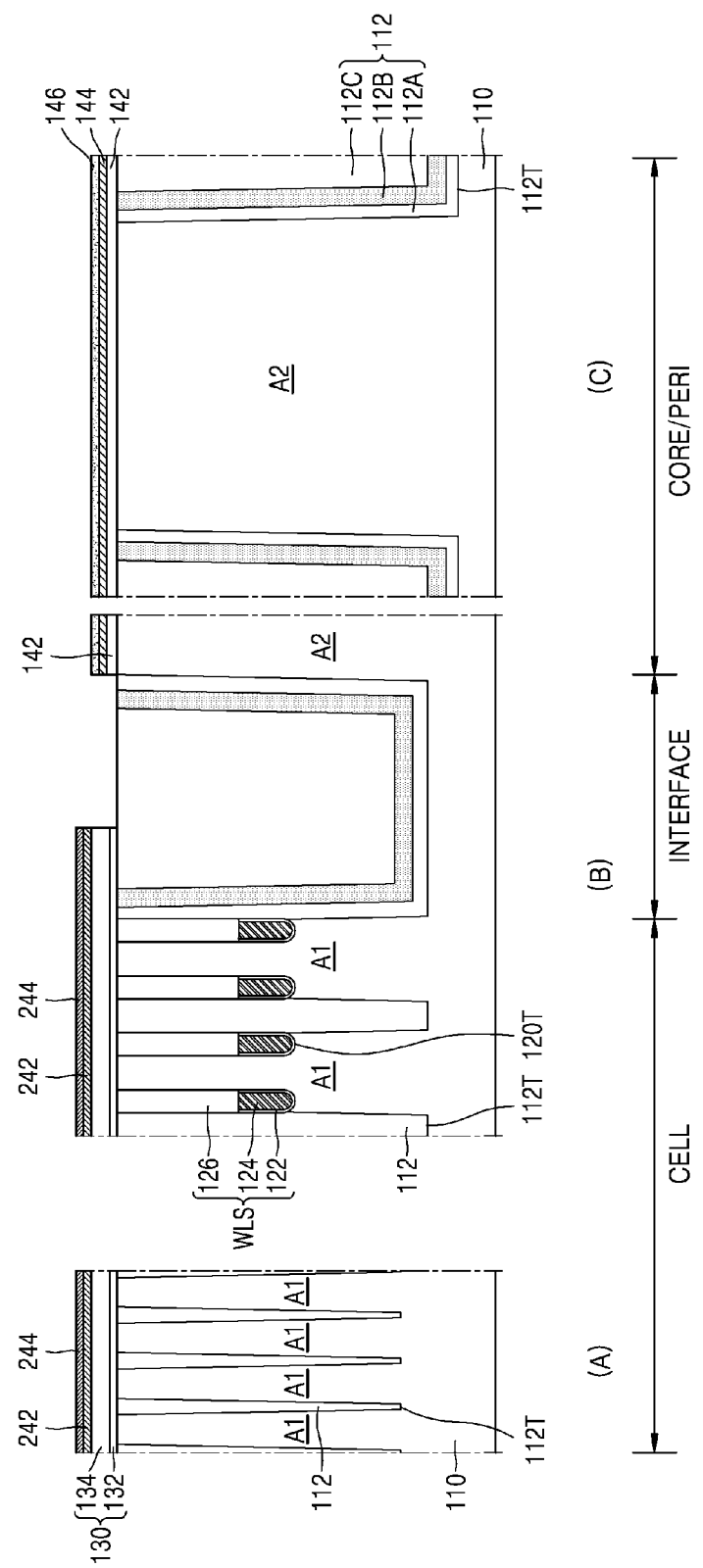
FIGS. 21 and 22 are cross-sectional views for explaining a method of manufacturing a semiconductor device according to some example embodiments of inventive concepts, and the semiconductor device manufactured according to the method.
Figure 22:
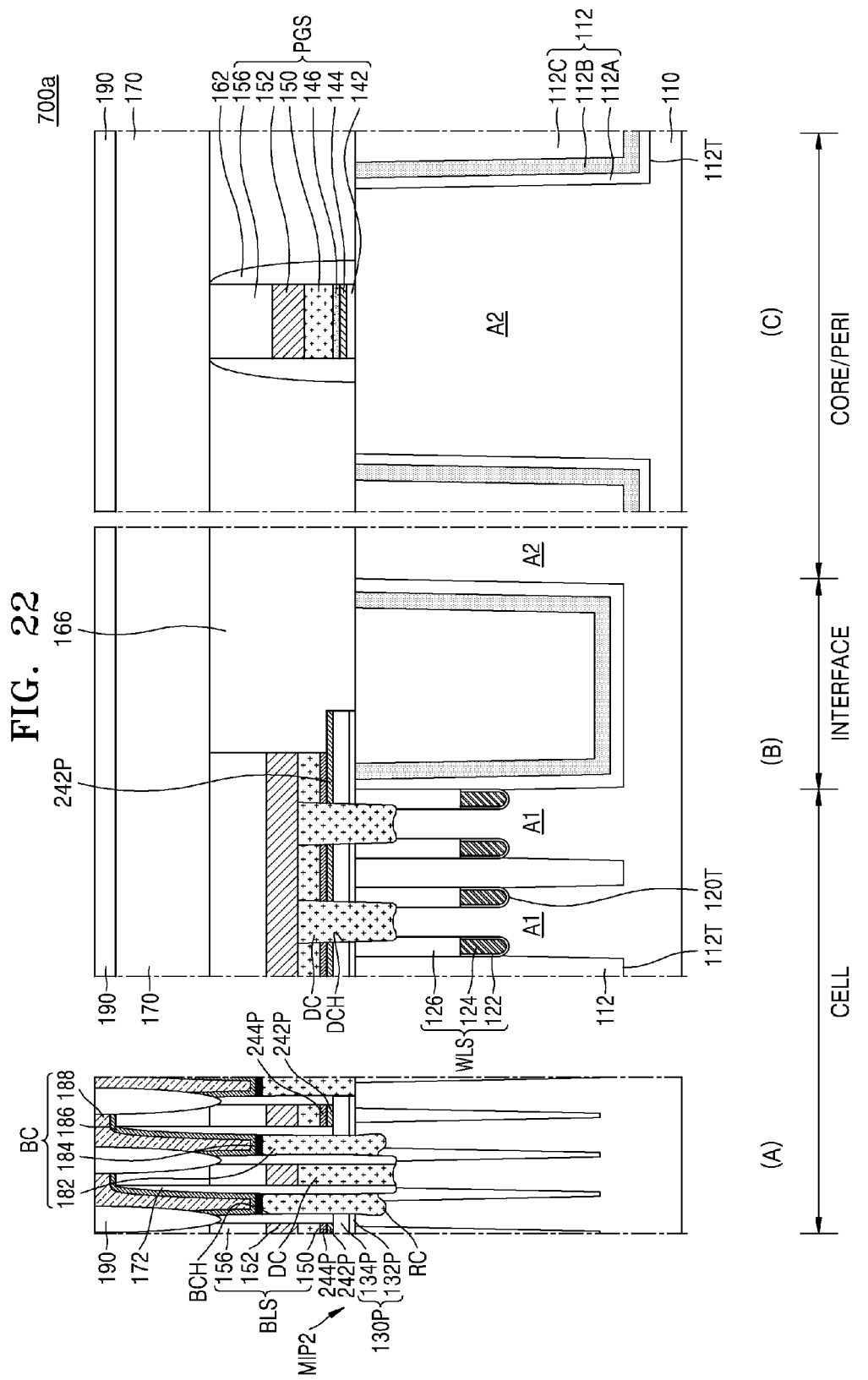

FIGS. 21 and 22 are cross-sectional views for explaining a method of manufacturing a semiconductor device according to some example embodiments of inventive concepts, and the semiconductor device manufactured according to the method.

In detail, FIGS. 21 and 22 are provided to describe an example manufacturing method of a DRAM device and a semiconductor device 700a manufactured according to the method. The semiconductor device 700a illustrated in FIGS. 21 and 22 may be identical to the semiconductor device 700 of FIGS. 10 through 20 except that a third protection pattern 244P is further included in a multiple insulation pattern MIP2. In FIGS. 21 and 22, like reference numerals as those in FIGS. 10 through 20 denote like elements, and repeated description will be briefly provided or omitted for convenience.

Operations of FIGS. 10 through 12 are sequentially performed. Accordingly, a first protection layer 130, a second protection layer 242, a second dielectric layer 244, and a metal-containing work function controlling layer 246 may be formed in the cell array region CELL and the interface region INTERFACE. In addition, a first dielectric layer 142, a second dielectric layer 144, and a metal-containing work function controlling layer 146 are sequentially formed in the peripheral circuit region CORE/PERI.

Referring to FIG. 21, the metal-containing work function controlling layer 246 formed in the cell array region CELL and the interface region INTERFACE is removed. Accordingly, the first protection layer 130, the second protection layer 242, and the second dielectric layer 244 may be formed in the cell array region CELL and the interface region INTERFACE. The first dielectric layer 142, the second dielectric layer 144, and the metal-containing work function controlling layer 146 may be formed in the peripheral circuit region CORE/PERI.

Next, the operations of FIGS. 14 through 20 are sequentially performed. Accordingly, a multiple insulation pattern MIP2 may be formed under the bit line structure BLS as illustrated in FIG. 22. The multiple insulation pattern MIP2 may include a first protection pattern 130P formed on the substrate 110, a second protection pattern 242P formed on the first protection pattern 130P, and a third protection pattern 244P formed on the second protection pattern 242P. The third protection pattern 244P may be formed by patterning the second dielectric layer 244. The third protection pattern 244P may be a metal-containing oxide pattern.

The multiple insulation pattern MIP2 may be disposed on an upper surface of the substrate 110 where the direct contact hole patterns DCH (FIG. 17) is not formed in the cell array region, and between the word line structures WLS and the bit line structures BLS. Due to the multiple insulation pattern MIP2, the substrate 110 may be protected, and the direct contact hole pattern DCH and the buried contact hole pattern BCH may be reliably formed.

Figure 23:
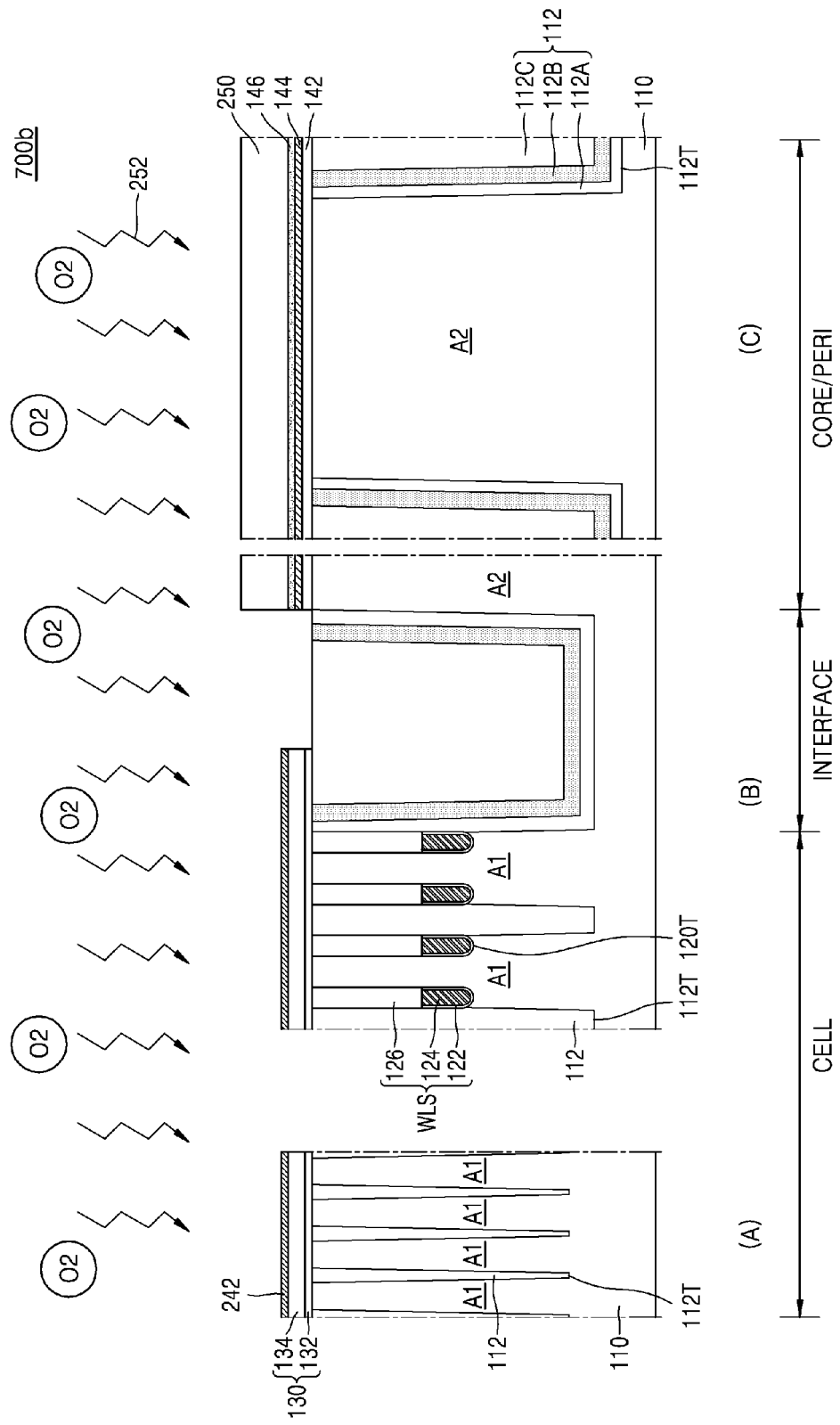
FIGS. 23 and 24 are cross-sectional views for explaining a method of manufacturing a semiconductor device according to some example embodiments of inventive concepts, and the semiconductor device manufactured according to the method.
Figure 24:
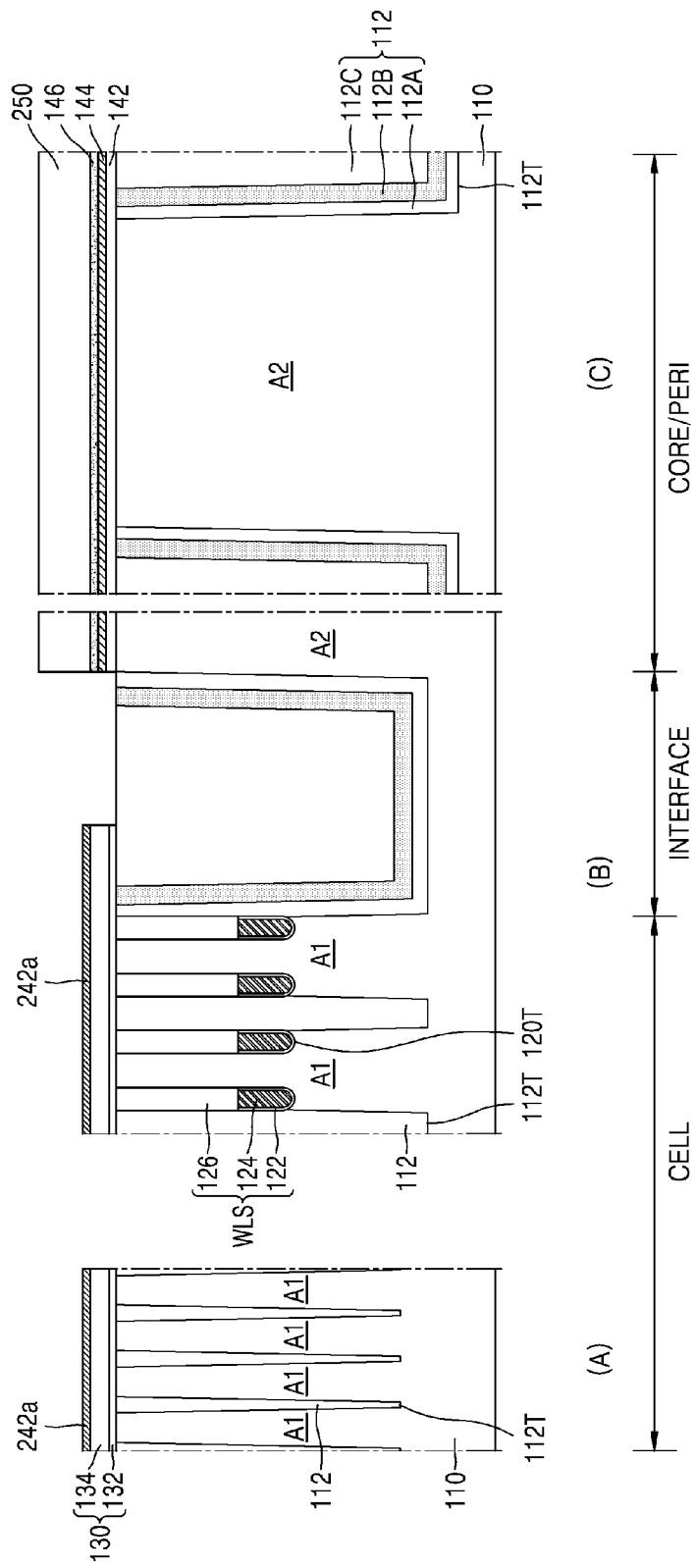

FIGS. 23 and 24 are cross-sectional views for explaining a method of manufacturing a semiconductor device according to some example embodiments of inventive concepts, and the semiconductor device manufactured according to the method.

In detail, FIGS. 23 and 24 are provided to describe an example manufacturing method of a DRAM device and a semiconductor device 700b manufactured according to the method. The semiconductor device 700b illustrated in FIGS. 23 and 24 may be identical to the semiconductor device 700 of FIGS. 10 through 20 except for a method of forming a second protection layer 242a included in the multiple insulation pattern MIP. In FIGS. 23 and 24, like reference numerals as those in FIGS. 10 through 20 denote like elements, and repeated description will be briefly provided or omitted for convenience.

The operations of FIGS. 10 and 11 are sequentially performed. Accordingly, a first protection layer 130 may be formed in the cell array region CELL and the interface region INTERFACE. As illustrated in FIG. 23, a first dielectric layer 142, a second dielectric layer 144, and a metal-containing work function controlling layer 146 are sequentially formed in the peripheral circuit region CORE/PERI. Also, a second protection layer 242 is formed on the first protection layer 130 in the cell array region CELL and the interface region INTERFACE. Next, a mask pattern 250 is formed on the metal-containing work function controlling layer 146. The mask pattern 250 may be a photoresist pattern.

Next, while the peripheral circuit region CORE/PERI is protected by the mask pattern 250, an oxygen plasma energy 252 is applied onto the first protection layer 130 of the cell array region CELL and the interface region INTERFACE.

Referring to FIG. 24, when the oxygen plasma energy 252 is applied onto the first protection layer 130 of the cell array region CELL and the interface region INTERFACE, a second protection layer 242a is formed on the first protection layer 130. The second protection layer 242a may be formed using a growth method by using oxygen plasma, instead of a deposition method. The second protection layer 242a may be a silicon oxide layer or a silicon oxy-nitride layer.

Next, the operations of FIGS. 14 through 20 are sequentially performed. Accordingly, the multiple insulation pattern MIP may be formed under the bit line structure BLS as illustrated in FIG. 20. The multiple insulation pattern MIP may include a second protection pattern 242P formed on the substrate 110 by using a growth method in which oxygen plasma is used.

Figure 25:
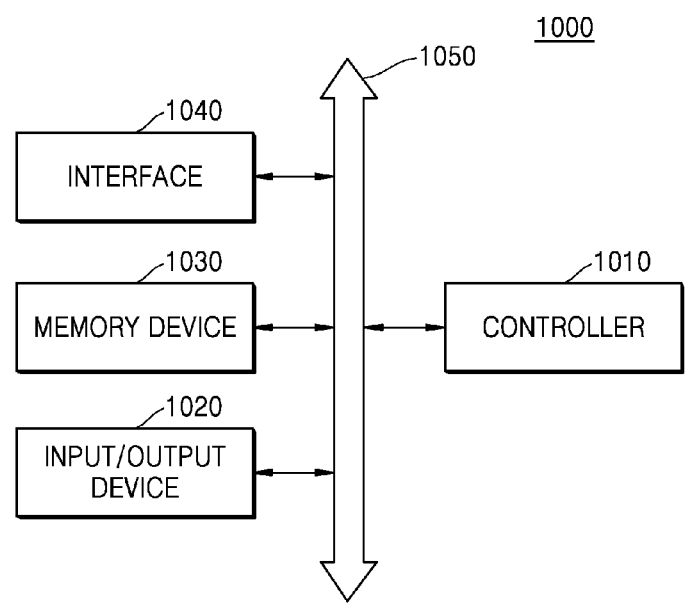
FIG. 25 is a system including a semiconductor device manufactured according to inventive concepts.

FIG. 25 is a system 1000 including a semiconductor device manufactured according to inventive concepts.

In detail, the system 1000 according to the present embodiment may include a controller 1010, an input/output device 1020, a memory device 1030, and an interface 1040. The system 1000 may be a mobile system or a system for transmitting or receiving information. In some embodiments, the mobile system may be a personal digital assistant (PDA), a portable computer, a web tablet, a wireless phone, a mobile phone, a digital music player or a memory card.

The controller 1010 is used to control an execution program in the system 1000, and may be a microprocessor, a digital signal processor, a microcontroller or other similar device. The input/output device 1020 may be used in inputting or outputting data of the system 1000. The system 1000 may be connected to an external device, for example, a personal computer or a network, via the input/output device 1020, and may exchange data with the external data. The input/output device 1020 may be, for example, a keypad, a keyboard or a display.

The memory device 1030 may store a code and/or data for operating the controller 1010, or may store data processed in the controller 1010. The memory device 1030 may include a semiconductor device according to inventive concepts. For example, the memory device 1030 may include at least one of the above-described semiconductor devices.

The interface 1040 may be a data transmission path between the system 1000 and another external device. The controller 1010, the input/output device 1020, the memory device 1030, and the interface 1040 may communicate with one another via a bus 1050.

The system 1000 may be used in, for example, a mobile phone, a MP3 player, a navigation device, a portable multimedia player (PMP), a solid state disk (SSD), or household appliances.

Figure 26:
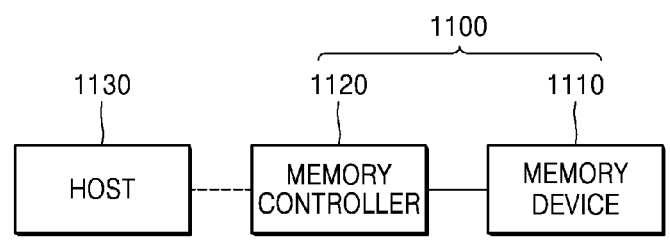
FIG. 26 is a memory card including a semiconductor device manufactured according to inventive concepts.

FIG. 26 is a memory card 1100 including a semiconductor device manufactured according to inventive concepts.

In detail, the memory card 1100 according to the present embodiment may include a memory device 1110 and a memory controller 1120. The memory device 1110 may store data. In some embodiments, the memory device 1110 may have non-volatile characteristics of retaining stored data even if a power supply is interrupted.

The memory controller 1120 may read data stored in the memory device 1110 or store data of the memory device 1110, in response to a read/write request by a host 1130. The memory controller 1120 may include at least one of the semiconductor devices manufactured according to the above-described methods.

While inventive concepts has been particularly shown and described with reference to embodiments thereof and using specific terms, these embodiments are provided so that this disclosure will fully convey the concept of inventive concepts, and not for purposes of limitation. Thus, various changes and other equivalents may be made therein. Therefore, the scope of inventive concepts is defined not by the detailed description of inventive concepts but by the appended claims.

What is claimed is:
1. A semiconductor device comprising:
a support layer,
   the support layer including a plurality of first contact hole patterns in the support layer,
   the plurality of first contact hole patterns being spaced apart from each other in a first direction and a second direction that is perpendicular to the first direction;
a plurality of first wiring line patterns on the support layer,
   the plurality of first wiring line patterns extending on the support layer in the first direction, and
   the plurality of first wiring line patterns being spaced apart from each other in the second direction such that the plurality of first contact hole patterns are planarly between the plurality of first wiring line patterns;
a plurality of second wiring line patterns on the plurality of first wiring line patterns and the plurality of first contact hole patterns,
   the plurality of second wiring line patterns extending in the second direction in a direction perpendicular to the first wiring line patterns and spaced apart from each other in the first direction; and
a multiple insulation pattern on an upper surface of the support layer where the plurality of first contact hole patterns are not formed, the multiple insulation pattern being arranged in a third direction that is perpendicular to the first direction and the second direction, and the multiple insulation pattern being between the plurality of first wiring line patterns and the plurality of second wiring line patterns.

2. The semiconductor device of claim 1, wherein
the support layer includes a plurality of second contact hole patterns in the support layer,
the plurality of second contact hole patterns are planarly arranged to be spaced apart from each other in the first direction and the second direction,
the plurality of second contact hole patterns are between the plurality of first wiring line patterns and the plurality of second wiring line patterns, and the plurality of second contact hole patterns are adjacent to the plurality of first contact hole patterns.

3. The semiconductor device of claim 1, wherein
the plurality of second wiring line patterns include a contact pattern and a non-contact pattern,
the contact pattern is in the plurality of first contact hole patterns, and
the non-contact pattern is on a portion of the support layer where the first contact hole patterns are not formed.

4. The semiconductor device of claim 1, wherein
the multiple insulation pattern includes a first protection pattern and a second protection pattern,
the first protection pattern is on the support layer, and
the second protection pattern is on the first protection pattern,
wherein a width of the second protection pattern in the first direction is shorter than that of the first protection pattern.

5. The semiconductor device of claim 4, wherein
the first protection pattern includes a first silicon oxide pattern, and
the first protection pattern includes a first silicon nitride pattern on the first silicon oxide pattern.

6. The semiconductor device of claim 4, wherein the second protection pattern includes a second silicon oxide pattern or a second silicon oxy-nitride pattern.

7. The semiconductor device of claim 4, wherein the second protection pattern includes a thermal silicon oxide growth pattern or a thermal silicon oxy-nitride growth pattern.

8. The semiconductor device of claim 4, wherein the second protection pattern includes a plasma silicon oxide growth pattern or a plasma silicon oxy-nitride growth pattern.

9. The semiconductor device of claim 4, wherein the multiple insulation pattern includes a third protection pattern on the second protection pattern.

10. The semiconductor device of claim 9, wherein the third protection pattern includes a metal-containing oxide pattern.

11. A semiconductor device comprising:
a substrate;
a plurality of word lines extending in a first direction in the substrate, the plurality of word lines being spaced apart from each other in a second direction that is perpendicular to the first direction;
a plurality of direct contact hole patterns in the substrate between the plurality of word lines in the first direction and the second direction;
a plurality of bit lines on the word lines and the direct contact hole patterns, the plurality of bit lines extending in the second direction perpendicular to the plurality of word lines and spaced apart from each other in the first direction;
a multiple insulation pattern on an upper surface of the substrate where the direct contact hole patterns are not formed, the multiple insulation pattern arranged in a third direction perpendicular to the first direction and the second direction, and between the plurality of word lines and the plurality of bit lines; and
a plurality of buried contact hole patterns on the substrate between the plurality of bit lines and the plurality of word lines,
the plurality of buried contact hole patterns being adjacent to the plurality of direct contact hole patterns,
the substrate including a plurality of device isolation trenches that define a plurality of cell active regions, and
a bottom surface of the plurality of buried contact hole patterns having a higher level over the plurality of device isolation trenches than over the plurality of cell active regions.

12. The semiconductor device of claim 11, wherein
the multiple insulation pattern includes a first protection pattern and a second protection pattern,
the first protection pattern is on the substrate, and
the second protection pattern is on the first protection pattern.

13. The semiconductor device of claim 12, wherein the multiple insulation pattern further includes a third protection pattern on the second protection pattern.

14. A semiconductor device comprising:
a substrate having a cell array region and a peripheral circuit region, the cell array region including a cell active region, and the peripheral circuit region including a peripheral circuit active region;
a plurality of word line structures extending in the cell active region in the substrate in a first direction, the plurality of word line structures being spaced apart from each other in a second direction perpendicular to the first direction;
a plurality of direct contact hole patterns opening the cell active region between the plurality of word line structures of the cell array region, and the plurality of direct contact holes patterns being spaced apart from each other in the substrate;
a plurality of bit line structures extending on the direct contact hole patterns and the substrate of the cell array region, the plurality of bit line structures extending in the second direction perpendicular to the word line structures, the plurality of bit line structures being spaced apart from each other in the first direction;
a multiple insulation pattern on an upper surface of the substrate in the cell array region where the direct contact hole patterns are not formed, the multiple insulation pattern being arranged in a third direction perpendicular to the first direction and the second direction, the multiple insulation pattern being arranged between the plurality of word line structures and the plurality of bit line structures; and
a peripheral circuit gate structure on the peripheral circuit active region of the peripheral circuit region;
a plurality of buried contact hole patterns on the substrate; and
a plurality of buried contacts in the plurality of buried contact hole patterns, wherein
the plurality of buried contact hole patterns open the cell active region,
the plurality of buried contacts are arranged between the plurality of bit line structures and the plurality of word line structures,
the substrate includes a device isolation trench that defines the cell active region, and
a bottom surface of the plurality of buried contact hole patterns has a higher level over the device isolation trench than over the cell active region.

15. The semiconductor device of claim 14, wherein
the substrate includes an interface region between the cell array region and the peripheral circuit region, and
the multiple insulation pattern is in a portion of the interface region of the substrate.

16. The semiconductor device of claim 14, wherein the peripheral circuit gate structure includes a metal gate.

17. The semiconductor device of claim 14, wherein
the multiple insulation pattern includes a first protection pattern on the substrate in the cell array region, and
the multiple insulation pattern includes a second protection pattern on the first protection pattern.

18. The semiconductor device of claim 17, wherein
the multiple insulation pattern further includes a third protection pattern on the second protection pattern, and
the third protection pattern includes a metal containing oxide pattern.

* * * * *